(12) United States Patent
Ruby et al.

(10) Patent No.: US 9,567,661 B2
(45) Date of Patent: Feb. 14, 2017

(54) REACTOR DEVICE WITH REMOVABLE DEPOSITION MONITOR

(71) Applicant: SUPERCONDUCTOR TECHNOLOGIES, INC., Santa Barbara, CA (US)

(72) Inventors: Ward Ruby, Palm City, FL (US); Kurt Von Dessonneck, Auburn, CA (US); Brian Moeckly, Santa Barbara, CA (US)

(73) Assignee: SUPERCONDUCTOR TECHNOLOGIES, INC., Austin, TX (US)

( * ) Notice: Subject to any disclaimer, the term of this patent is extended or adjusted under 35 U.S.C. 154(b) by 0 days.

(21) Appl. No.: 14/935,136

(22) Filed: Nov. 6, 2015

(65) Prior Publication Data

US 2016/0060745 A1    Mar. 3, 2016

Related U.S. Application Data

(63) Continuation of application No. 13/336,308, filed on Dec. 23, 2011, now abandoned, which is a continuation of application No. 11/293,346, filed on Dec. 2, 2005, now abandoned.

(51) Int. Cl.

| | | |
|---|---|---|
| *C23C 14/00* | (2006.01) | |
| *C23C 14/50* | (2006.01) | |
| *C23C 14/54* | (2006.01) | |
| *C23C 14/24* | (2006.01) | |
| *C23C 14/56* | (2006.01) | |

(52) U.S. Cl.

CPC ........... *C23C 14/0021* (2013.01); *C23C 14/24* (2013.01); *C23C 14/505* (2013.01); *C23C 14/541* (2013.01); *C23C 14/546* (2013.01); *C23C 14/566* (2013.01)

(58) Field of Classification Search

CPC .... C23C 14/0021; C23C 14/24; C23C 14/505; C23C 14/546; C23C 14/541; C23C 14/566

See application file for complete search history.

(56) References Cited

U.S. PATENT DOCUMENTS

| | | |
|---|---|---|
| 2,960,949 A | 11/1960 | Smith et al. |
| 3,570,449 A | 3/1971 | Blecherman et al. |
| 3,763,821 A | 10/1973 | Gorinas et al. |
| 3,796,182 A | 3/1974 | Rosler |
| 4,002,141 A | 1/1977 | Shrader |
| 4,607,152 A | 8/1986 | Allovon et al. |
| 5,588,999 A | 12/1996 | Takahashi |
| 5,683,518 A | 11/1997 | Moore et al. |

(Continued)

FOREIGN PATENT DOCUMENTS

| | | | |
|---|---|---|---|
| JP | 05121033 A | * | 5/1993 |

OTHER PUBLICATIONS

Fujita, J. et al., Preferentially Oriented Epitaxial Y-Ba-Cu-O Films Prepared by the Ion Beam Sputtering Method, J. Appl. Phys. 64(3), Aug. 1, 1988.

(Continued)

*Primary Examiner* — Jeffrie R Lund
(74) *Attorney, Agent, or Firm* — Vista IP Law Group LLP

(57) ABSTRACT

A reactor apparatus includes a first chamber coupled to a first source of vacuum, a monitor chamber isolated from the first chamber and coupled to a second source of vacuum, and at least one removable deposition monitor disposed in the monitor chamber.

8 Claims, 27 Drawing Sheets

(56) References Cited

U.S. PATENT DOCUMENTS

| | | | |
|---|---|---|---|
| 5,858,450 A * | 1/1999 | Fujimura | C03C 17/001 118/712 |
| 5,893,050 A | 4/1999 | Park et al. | |
| 6,234,788 B1 | 5/2001 | Lee | |
| 6,395,563 B1 | 5/2002 | Eriguchi | |
| 6,527,866 B1 | 3/2003 | Matijasevic et al. | |
| 6,565,662 B2 | 5/2003 | Amano et al. | |
| 6,606,154 B1 | 8/2003 | Oda | |
| 6,616,818 B2 | 9/2003 | Gibson | |
| 6,709,523 B1 | 3/2004 | Toshima et al. | |
| 7,347,900 B2 | 3/2008 | Choi | |
| 7,439,208 B2 | 10/2008 | Moeckly et al. | |
| 8,454,749 B2 | 6/2013 | Li | |
| 2002/0008891 A1 | 1/2002 | Mearini et al. | |
| 2002/0050160 A1 | 5/2002 | Kelson et al. | |
| 2002/0129476 A1 | 9/2002 | Eriguchi | |
| 2002/0132374 A1 | 9/2002 | Basceri et al. | |
| 2003/0131789 A1 | 7/2003 | Amemiya | |
| 2003/0172872 A1 | 9/2003 | Thakur et al. | |
| 2003/0209200 A1 | 11/2003 | Kuznetsov et al. | |
| 2004/0031442 A1 | 2/2004 | Yamazaki et al. | |
| 2004/0123804 A1 | 7/2004 | Yamazaki et al. | |
| 2005/0116204 A1 | 6/2005 | Moeckly et al. | |
| 2006/0105195 A1 | 5/2006 | Belousov et al. | |
| 2007/0125303 A1 * | 6/2007 | Ruby | C23C 14/0021 118/724 |
| 2007/0246356 A1 | 10/2007 | Tokimitsu | |
| 2008/0145534 A1 | 6/2008 | Lee et al. | |
| 2009/0068355 A1 | 3/2009 | Moeckly et al. | |
| 2009/0290967 A1 | 11/2009 | Jamieson et al. | |
| 2010/0129548 A1 * | 5/2010 | Sneh | C23C 16/4409 427/248.1 |
| 2010/0316788 A1 | 12/2010 | Dieguez-Campo et al. | |
| 2012/0090542 A1 * | 4/2012 | Ruby | C23C 14/0021 118/712 |
| 2016/0060745 A1 * | 3/2016 | Ruby | C23C 14/0021 118/712 |

OTHER PUBLICATIONS

Naito, M. et al., Production of Double-Sided Large-Area High Tc Wafers by Molecular Beam Epitaxy, IEEE Trans. on Applied Superconductivity, vol. 11, No. 1, Mar. 2001.

Kwo, J. et al., In Situ Epitaxial Growth of Y1Ba2Cu3O7-x Films by Molecular Beam Epitaxy With an Activated Oxygen Source, Appl. Phys. Lett. 53(26), Dec. 26, 1988.

Berkley, D. et al., In Situ Formation of Superconducting YBa2Cu3O7-x Thin Films Using Pure Ozone Vapor Oxidation, Appl. Phys. Lett. 53(20), Nov. 14, 1988.

Johnson, B.R. et al., In Situ Growth of DyBa2Cu3O7-x Thin Films by Molecular Beam Epitaxy, Appl. Phys. Lett. 56 (19), May 7, 1990.

Hellman, E.S. et al., Molecular Beam Epitaxy of Dysprosium Barium Cuprous Oxides Using Molecular Oxygen, J. Mater. Res. vol. 7, No. 4, Apr. 1992.

Matijasevi, V.C., Growth and Properties of Reactively Coevaporated Superconducting Yttrium-Barium-Copper-Oxide Thin Films, Ph.D. Thesis, Stanford Univ., pp. 36-45, 1991.

Matijasevic, V. et al., Reactive Coevaporation of YBaCuO Superconducting Films, J. Mater. Res., vol. 6, No. 4, Apr. 1991.

Humphreys, R.G. et al., Physical Vapour Deposition Techniques for the Growth of YBa2Cu3O7 Thin Films, Supercond. Sci. Technol. 3, 38 (1990).

Silver, R.M. et al., As-Deposited Superconducting Y-Ba-Cu-O Thin Films on Si, A12O3, and SiTiO3 Substrates, Appl. Phys. Lett. 52(25), Jun. 20, 1988.

Maul, M. et al., Thin YBa2CU3O7-gamma Films by Electron-Beam Coevaporation-Growth and in Situ Characterization, J. Appl. Phys. 73(4), Feb. 15, 1993.

Moriwaki, K. et al., As-Deposited Superconducting Ba2YCu3O7-gamma Films Using ECR Ion Beam Oxidation, Jap. Journal of Appl. Phys., vol. 27, No. 11 Nov. 1988, pp. L2075-L2077.

Toshiyuki, A. et al., Thin Film Growth of YBa2Cu3O7-x by Ecr Oxygen Plasma Assisted Reactive Evaporation, Jap. Journal of Appl. Phys., vol. 28, No. 4, Apr. 1989, pp. L635-L638.

Chang, H.J. et al., Preparation of YBa2CU3O7-x Thin Films by Reactive Evaporation Method, Cryogenics 32, 279 (1992).

Berberich, P. et al., Homogenous High Quality YBa2CU3O7 Films on 3' and 4' Substrates, Physica C 219 (1994), 497-504.

Kinder, H. et al., Double Sided Ybco Films on 4' Substrates by Thermal Reactive Evaporation, IEEE Trans. on App. Superconductivity, vol. 5, No. 2, Jun. 1995.

Semerad, R. et al., Coevaporation of YBa2Cu3O7 films up to 9 inches in diameter, Inst. Phys. Conf. Ser. No. 148, Edinburgh, Jul. 3-6, 1995.

Prusseit, W. et al., YBCO and Buffer Layer Deposition on Long Length Metal Tape Substrates by Thermal Evaporation, ISTEC Workshop, Honolulu, HI Jun. 24-27, 2001.

Nemetschek, R. et al., Continuous Tape Coating by Thermal Evaporation, ASC, Houston, TX, Aug. 5-9, 2002.

Prusseit, W. et al., Series Production of Large Area YBa2Cu3O7—Films for Microwave and Electrical Power Applications, EUCAS, Sep. 13-17, 1999.

Prusseit, W. et al., Methods of HTS Deposition: Thermal Evaporation.

Egly, J. et al., YBa2Cu3O7-deposition on metal tape substrates, EUCAS '99, Sep. 17, 1999, Sitges, Spain.

Kinder, H. et al., Very Large Area YBa2Cu3O7-8 film deposition, SPIE, vol. 2697, 1996, pp. 154-159.

PCT International Search Report for PCT/US2006/061186, Applicant: Superconductor Technologies, Inc., Form PCT/ISA/210 and 220, dated Sep. 17, 2008 ( 8 pages).

PCT Written Opinion of the International Search Authority for PCT/US2006/061186, Applicant: Superconductor Technologies Form PCT/ISA/237, dated Sep. 17, 2008 (7 pages).

EP Supplementary European Search Report for PCT/US2006/061186, Applicant: Superconductor Technologies, EPO Form 1507S, 1503 (PO4C04), P0459 and EPA Form 2906, Docket No. STI-002WO, dated Dec. 11, 2009 (7 pages).

Kinder, H. et al., YBCO Film Deposition on Very Large Areas Up to 20x20 cm^2, Physica C 282-287 (1997) 107-110 (4 pages).

* cited by examiner

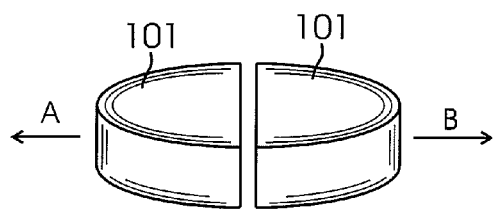
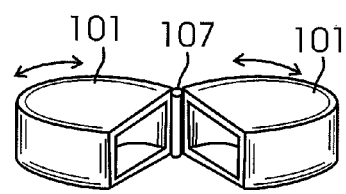
Fig. 10A           Fig. 10B
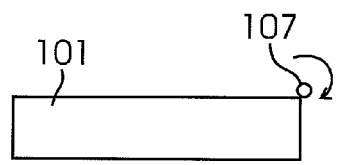
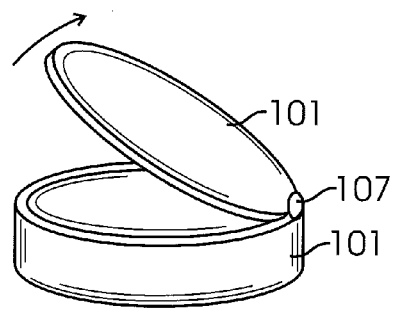
Fig. 10C           Fig. 10D
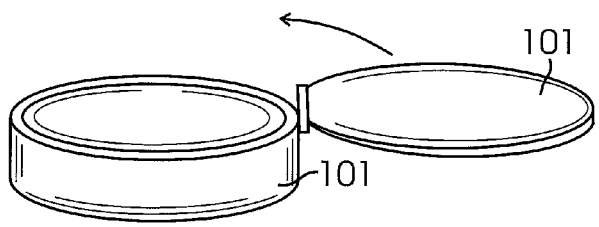
Fig. 10E

REACTOR DEVICE WITH REMOVABLE DEPOSITION MONITOR

RELATED APPLICATIONS

This Application is a continuation of U.S. patent application Ser. No. 13/336,308 filed on Dec. 23, 2011, which is a continuation of U.S. application Ser. No. 11/293,346, filed on Dec. 2, 2005. Priority is claimed pursuant to 35 U.S.C. §120. The above-noted Applications are incorporated by reference as if set forth fully herein.

FIELD OF THE INVENTION

The field of the invention generally relates to devices and methods used to produce thin films on a substrate. More specifically, the field of the invention relates to devices and methods used to form high-temperature superconducting (HTS) films in-situ.

BACKGROUND OF THE INVENTION

Since the discovery in the mid 1980s of the perovskite family of HTS materials, extensive strides have been made in the ability to deposit high quality HTS films. Thin films formed from HTS materials are highly desirable for a variety of superconductive electronics applications including, for example, detectors, digital circuits, and passive microwave devices (e.g., HTS-based filters).

Over the years, several techniques have been developed for the deposition of thin films of HTS oxide materials. These techniques include sputtering, pulsed laser deposition (PLD), and metal-organic chemical vapor deposition (MOCVD). Illustrative HTS oxide materials include Yttrium Barium Copper Oxide (YBCO), Bismuth Strontium Calcium Copper Oxide (BSCCO), Thallium Barium Calcium Copper Oxide (TBCCO), and Mercury Barium Calcium Copper Oxide (HBCCO). Of these materials, YBCO is currently the favored compound for many applications due to YBCO's relatively smaller conduction anisotropy, high superconductive critical current in a magnetic field, and good chemical stability. In addition, as compared to the other HTS compounds, the relative ease with which high quality, single phase thin films of YBCO may be grown is perhaps its greatest attribute.

Nonetheless, thin film growth of these materials has still been difficult. In order to obtain high quality films, oriented, epitaxial growth (in-plane and out-of-plane) is necessary, meaning that the films can be grown only at high temperatures, typically above 700° C. Therefore, growth is only possible on a handful of single crystal substrates that satisfy strict requirements of chemical compatibility, lattice constant match, and thermal expansion match. In addition, the properties of the substrate must be suitable for the required application. For example, MgO is a substrate that meets the growth needs and also has sufficiently low loss for microwave applications.

Growth of HTS materials is further complicated by the fact that these compounds typically comprise at least three metallic species which are in oxide form. The growth methods employed must therefore be strictly controlled in order to achieve the proper film stoichiometry and uniformity. Furthermore, in-situ growth of these materials requires them to be oxygenated as they are grown, which is generally not compatible with many conventional techniques such as physical vapor deposition. Moreover, in certain applications, growth of HTS thin films on two sides of a single substrate is required.

Conventional in-situ growth techniques such as sputtering, pulsed laser deposition, and metal-organic chemical vapor deposition have all been successfully used for the growth of HTS thin films. There are, however, serious limitations to these methods including slow growth rate (sputtering), difficulty in controlling composition, poor reproducibility, poor film uniformity (sputtering, MOCVD), difficulty of achieving large-area deposition (PLD), and difficulty of scalability (all aforementioned techniques).

More recently, the technique of reactive coevaporation using a rotating oxygen-pocket heater has been used which addresses many of the limitations discussed above. In this technique, the substrates are held by gravity on a rotating substrate support member or turntable. The substrate support member containing the substrates is surrounded on the top, bottom, and sides by a cylindrically-shaped heater (i.e., a heater body) that radiatively heats the substrates to a uniform high temperature necessary for reaction. The substrate support member is rotatable inside the heater body and, during a portion of the rotation, is exposed to a vacuum chamber via a window disposed in the underside portion of the heater body. The vacuum chamber surrounds the heater body and contains the deposition sources for the reaction.

In one embodiment, the heater body also includes an oxygen pocket region located in the bottom portion of the heater body. Oxygen is fed into the oxygen pocket region and thereby exposes the substrates to oxygen during a portion of the rotation. A large pressure differential is created between the oxygen pocket region and the surrounding vacuum chamber. The pressure differential is maintained by a narrow gap formed between the rotating substrate support member and the oxygen pocket region, thereby resulting in a low rate of oxygen leakage from the oxygen pocket.

During the part of the rotation where the substrates are exposed to the vacuum chamber, the thin film constituents (typically metallic species) may be deposited onto the underside of the substrates using typical PVD techniques such as evaporation. Oxidation reactions take place when the substrates are rotated on the substrate support member into the oxygen pocket.

Reactive coevaporation using a rotating oxygen pocket heater has several advantages including, for example, the ability to evaporate the metallic species in vacuum without complications that would arise under the high oxygen pressure conditions needed for growth of HTS films. In addition, the rotating oxygen pocket heater technique permits deposition on substrates having a relatively large surface area. Moreover, this technique has the ability to deposit HTS materials on multiple substrates at once. Because the heater approximates a blackbody radiator, different substrate materials can also be incorporated simultaneously even if they have different absortivities. Finally, reactive coevaporation using the rotating oxygen pocket heater allows one to deposit HTS materials on both sides of the substrate sequentially because neither side of the substrate is in direct contact with the heater body.

While reactive coevaporation methods are well suited for the formation of HTS thin films, there remains a need to increase the capacity and stability of such methods so that reactive coevaporation can be implemented into a commercially viable manufacturing process. There thus is a need to increase the throughput and reliability of reactive coevaporation deposition systems and methods.

SUMMARY OF THE INVENTION

In a first embodiment of the invention, a reactor apparatus includes a first chamber coupled to a first source of vacuum, a monitor chamber isolated from the first chamber and coupled to a second source of vacuum, and at least one removable deposition monitor disposed in the monitor chamber.

In another embodiment of the invention, a reactor apparatus includes a first chamber, a monitor chamber partially isolated from the first chamber and coupled to a source of vacuum, the monitor chamber further comprising a non-isolated portion that is exposed to the first chamber, and at least one removable deposition monitor disposed in the partially isolated portion of the monitor chamber.

In another embodiment of the invention, a reactor apparatus includes a first chamber, a monitor chamber selectively isolated from the first chamber and coupled to a source of vacuum, the monitor chamber comprising a valve configured to selectively expose the monitor chamber to the first chamber, and at least one removable deposition monitor disposed in the monitor chamber.

It is an object of the invention to provide a device and method that increases the throughput of multi-component HTS films deposited/grown on substrates using reactive coevaporation. It is a further object of the invention to separate various aspects of the deposition process (e.g., source material evaporation, loading, unloading, monitoring, deposition) into interlinked but separate chambers. In this regard, it is an object of the invention to couple these chambers to vacuum sources which can be pumped independently of the remaining chambers, thereby limiting the overall pump down time of the device when vacuum conditions are broken in one of the separate chambers.

These and further objects of the invention are described in more detail below.

BRIEF DESCRIPTION OF THE DRAWINGS

FIG. 10A illustrates one embodiment of a separable heater element.

FIG. 10B illustrates another embodiment of a separable heater element.

FIG. 10C illustrates another embodiment of a separable heater element.

FIG. 10D illustrates another embodiment of a separable heater element.

FIG. 10E illustrates another embodiment of a separable heater element.

FIG. 19A illustrates a front view of a z-adjust device wherein a shaft of a motor is coupled via coupler to the spindle.

FIG. 19C illustrates a front view of a z-adjust device wherein a shaft of a motor is coupled to the spindle via a belt.

DETAILED DESCRIPTION OF THE PREFERRED EMBODIMENTS

Figure 1:
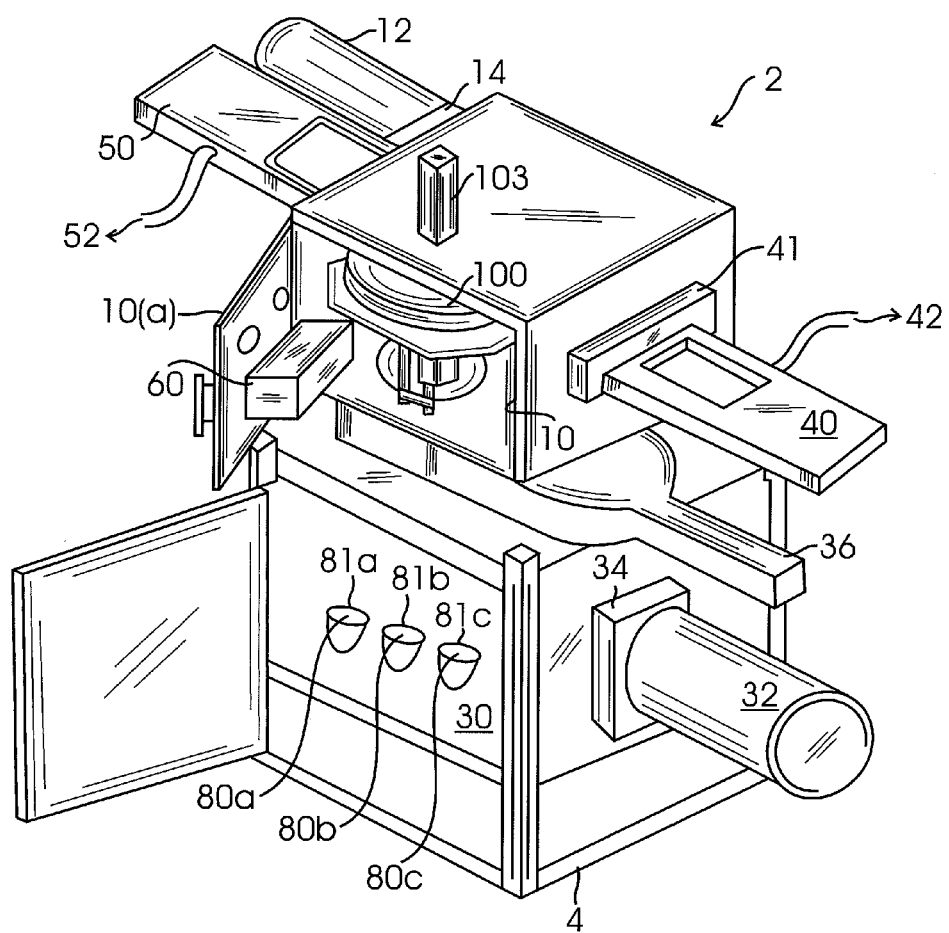
FIG. 1 illustrates a perspective view of a device used in the high-throughput deposition of oxide thin films by reactive coevaporation according to one preferred aspect of the invention.

FIG. 1 illustrates one embodiment of a device 2 used in the high-throughput deposition of oxide thin films by reactive coevaporation. The device 2 may also be used to deposit non-oxide materials such as, for example, Magnesium diboride ($MgB_2$). U.S. patent application Ser. No. 10/726,232, entitled "Growth of In-Situ Thin Films By Reactive Evaporation", incorporated by reference as if fully disclosed herein, discloses a method of forming $MgB_2$ using a pocket heater device. It should be understood that a variety of materials may be deposited using the device 2. These include by way of illustration and not limitation, complex oxides, ruthenates, manganates, titanates,—magnetic materials, piezoelectrics, dielectrics, ferroelectrics, semiconductors, nitrides, etc. The device 2 preferably includes several subsystems located on a frame 4 or other support structure which are integrated to form the overall device 2. The device 2 may include a plurality of separate chambers, namely, a heater chamber 10, a source chamber 30, two transfer chambers 40, 50, and a monitor chamber 60.

Heater chamber 10 is coupled to a source of vacuum 12 such as, for example, a vacuum pump. The source of vacuum 12 is separated from the heater chamber 10 by a valve 14 such as, for instance, a gate valve. Prior to the deposition of HTS film, the heater chamber 10 is evacuated using the source of vacuum 12.

The device 2 also includes a source chamber 30 which contains the source of flux material (80a, 80b, 80c) used in the deposition process. The source chamber 30 is similarly connected to a source of vacuum 32 such as, for example, a vacuum pump. The source chamber 30 is separated from the source of vacuum 32 by a valve 34 such as, for instance, a gate valve.

A valve 36 is also disposed between the heater chamber 10 and the source chamber 30. Preferably, the valve 36 is a gate valve. The gated arrangement advantageously allows the two chambers (i.e., heater chamber 10 and source chamber 30) to be pumped to vacuum separately. This is important because, for example, the flux sources located in the source chamber 30 can be changed without disturbing the heater chamber 10 or exposing it to atmospheric conditions. Similarly, maintenance or the like can be performed on components contained in the heater chamber 10 without disturbing the vacuum conditions inside the source chamber 30. This arrangement reduces the total amount of "pump down" time needed because the volume of space that must be pumped is reduced by isolating the various subsystems of the device 2. This aids in increasing the overall throughput of the device 2.

Still referring to FIG. 1, the device 2 includes two transfer chambers 40, 50 mounted on the external walls of the heater chamber 10. Preferably, one transfer chamber 40 is a loading chamber and the remaining transfer chamber 50 is an unloading chamber. Both transfer chambers 40, 50 are coupled to a source of vacuum 42, 52 such as, for example, a vacuum pump. The transfer chambers 40, 50 may be coupled to separate sources of vacuum 42, 52 or, alternatively, the same source of vacuum. The two transfer chambers 40, 50 are isolated from the heater chamber 10 by valves 41. Unloading chamber 50 may also be used as an oxygen soak.

In one aspect of the invention, the device 2 thus consists of five separate vacuum chambers (i.e., heater chamber 10, a source chamber 30, two transfer chambers 40, 50, and a monitor chamber 60) that are linked to another via controllable valves. Of course, in alternative embodiments, device 2 may have fewer than five chambers 50 or, alternatively, more than five chambers 50. Each of these chambers may be pumped to vacuum pressures independent of the other chambers if desired. In this regard, any one or multiple chambers may be vented to atmosphere while the remaining chambers remain under vacuum. This eliminates the need to pump down the entire device 2 each time it is opened, for example, to clean parts of the device 2, for reloading flux sources into the source chamber 30, for replacing and/or adjusting deposition monitors 64 in the monitor chamber 60 or in the heater chamber 10, for loading/unloading of the substrate support member 110 (e.g., carrier) into the heater chamber 10, or for maintenance or the like on the components in one or more the chambers.

Figure 2A:
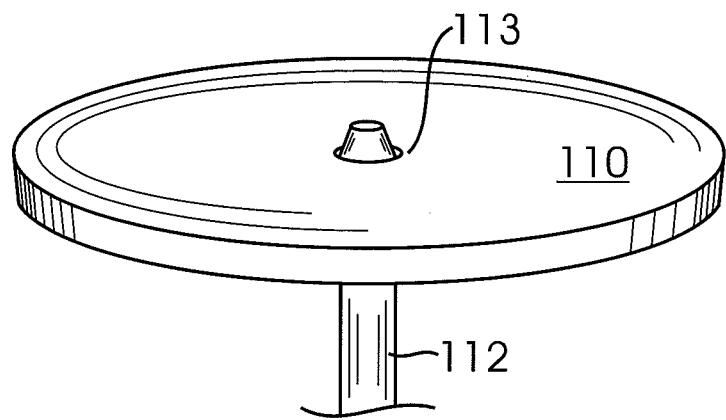
FIG. 2A illustrates a substrate support member gravitationally held on a spindle.
Figure 2B:
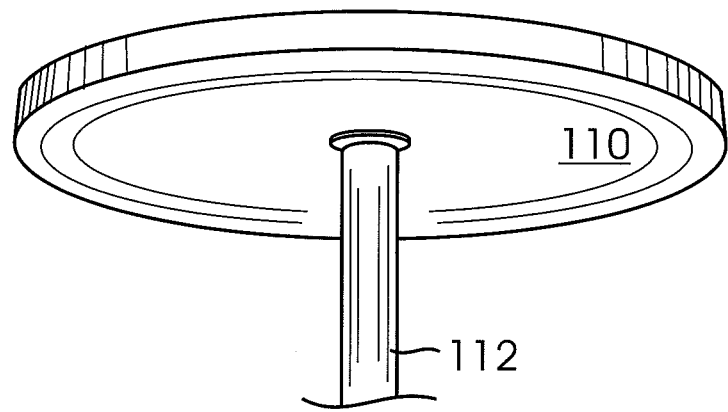
FIG. 2B illustrates the underside of the substrate support member shown in FIG. 2A.
Figure 3A:
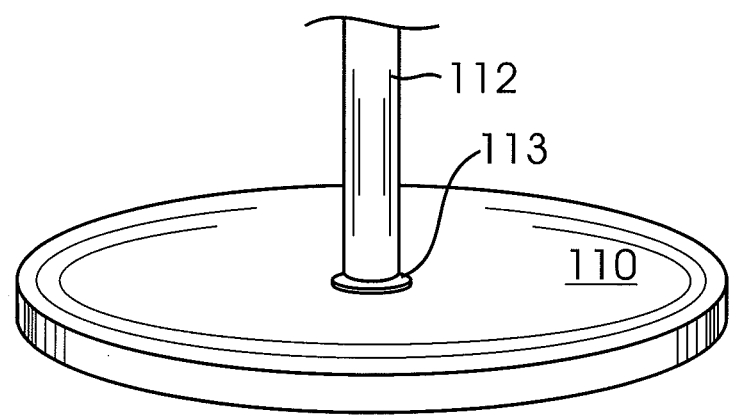
FIG. 3A illustrates a substrate support member gravitationally held on a spindle.
Figure 3B:
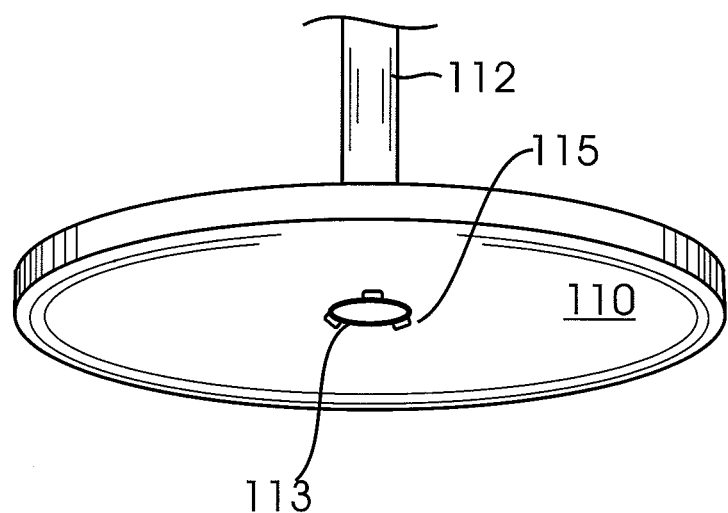
FIG. 3B illustrates the underside of the substrate support member shown in FIG. 3A.
Figure 4A:
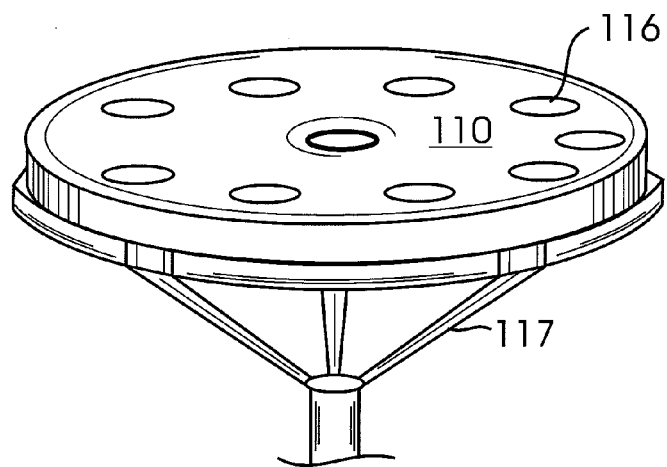
FIG. 4A illustrates a substrate support member that is held circumferentially via a substrate support member holder.
Figure 4B:
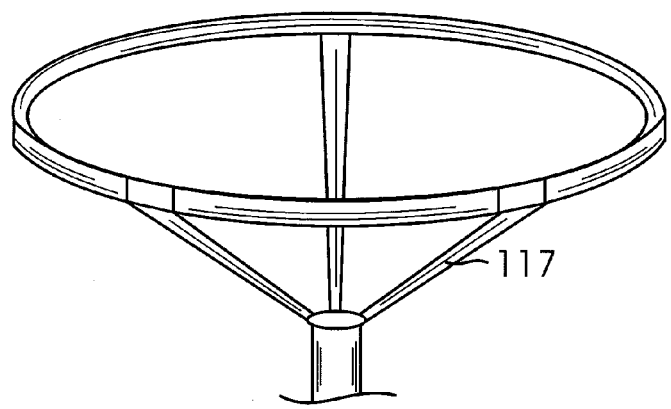
FIG. 4B illustrates a substrate support member holder and spindle.

Referring to FIGS. 2A, 2B, 3A, 3B, 4A, 4B, 5A, and 5B in one aspect of the invention, a substrate support member 110 is held on a vertically oriented spindle 112 through a center hole 113. The vertically oriented spindle 112 may hold the substrate support member 110 either from above or below. FIGS. 2A and 2B illustrate an embodiment wherein the substrate support member 110 is held from below by the spindle 112 passing through the center hole 113. In this embodiment, the substrate support member 110 is gravitationally held by the spindle 112. In another embodiment, as shown in FIGS. 3A and 3B, the vertically oriented spindle 112 holds the substrate support member 110 from above. For example, the spindle 112 may pass through a center hole 113 and terminate in an attachment member 115 that secures the substrate support member 110. In yet another embodiment, as shown in FIGS. 4A and 4B, substrate support member 110 is held circumferentially via a substrate support member holder 117.

Figure 5A:
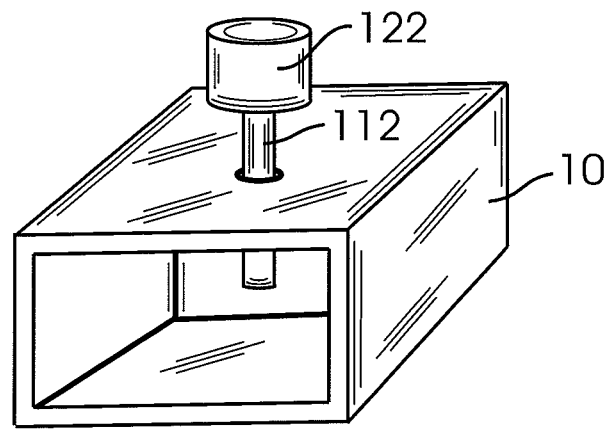
FIG. 5A illustrates a deposition chamber wherein the motor driving the spindle is located externally (top) with respect to the deposition chamber.
Figure 5B:
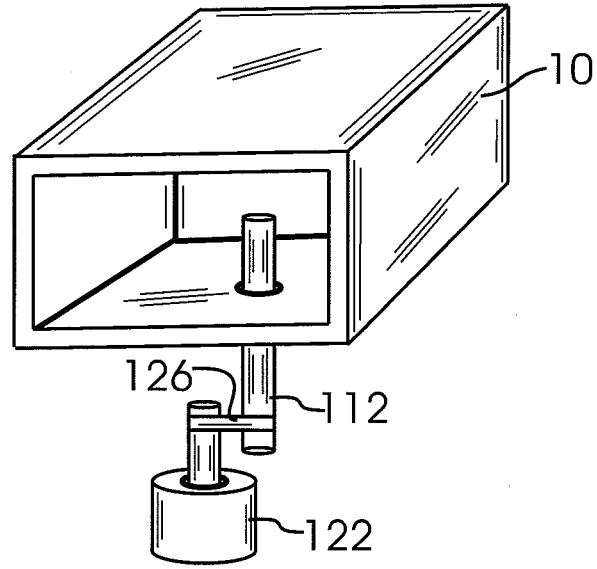
FIG. 5B illustrates a deposition chamber wherein the motor driving the spindle is located externally (bottom) with respect to the deposition chamber.
Figure 6A:
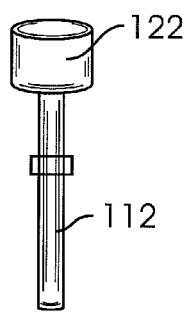
FIG. 6A illustrates a motor coupled to a spindle via a coupler.
Figure 6B:
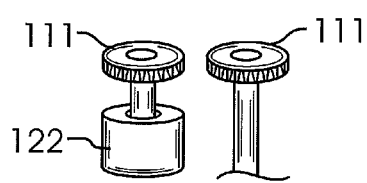
FIG. 6B illustrates a motor coupled to a spindle via gears.
Figure 6C:
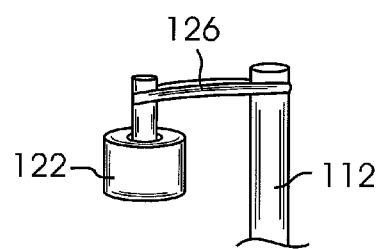
FIG. 6C illustrates a motor coupled to a spindle via a belt.

The substrate support member 110 may be rotated by rotational movement of the spindle 112. A frictional fit between the substrate support member 110 and spindle 112 imparts rotational movement of the spindle 112 to the substrate support member 110. The spindle 112 (and thus substrate support member 110) may be driven via a motor (such as motor 122 described below). The motor 122 may be located either within a deposition chamber (e.g., chamber 10) containing the substrate support member 110 or external to the deposition chamber 10, as shown in FIGS. 5A and 5B. In the case where the motor is located outside the deposition chamber 10 holding the substrate support member 110, the spindle 112 may be connected to a rotary vacuum feedthrough located either above or below the substrate support member 110 and vacuum chamber. The motor may be mechanically coupled directly to the spindle 112 as is shown in FIGS. 5A and 6A. Alternatively, the motor may be mechanically coupled to the spindle 112 via gears 111, belt 126, chain, or the like, for example, as shown in FIGS. 5B, 6B and 6C.

Figure 7A:
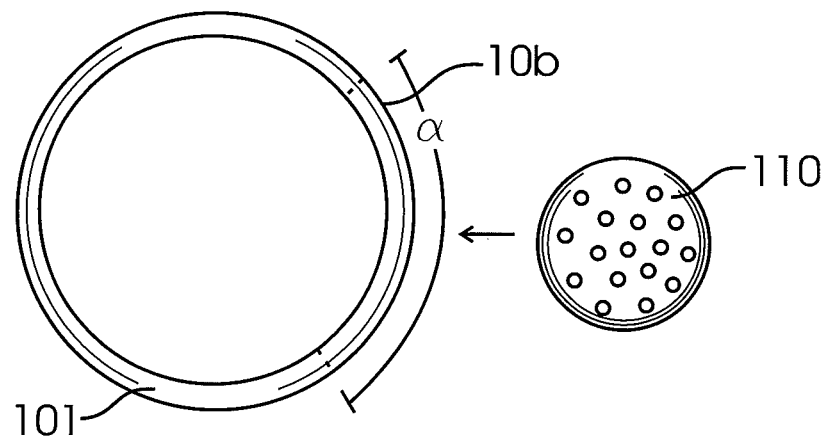
FIG. 7A illustrates a top down view of a heater element having a slot therein for receiving a substrate support member. The width of the slot is represented by angle α.
Figure 7B:
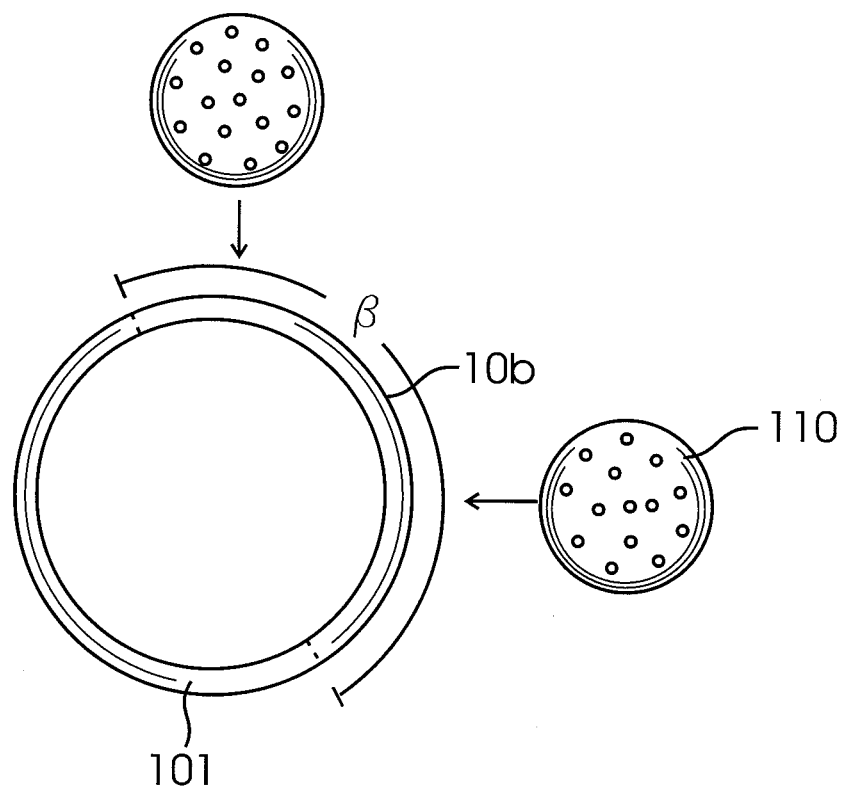
FIG. 7B illustrates a top down view of a heater element having a slot therein for receiving a substrate support member. The width of the slot is represented by angle β.
Figure 8A:
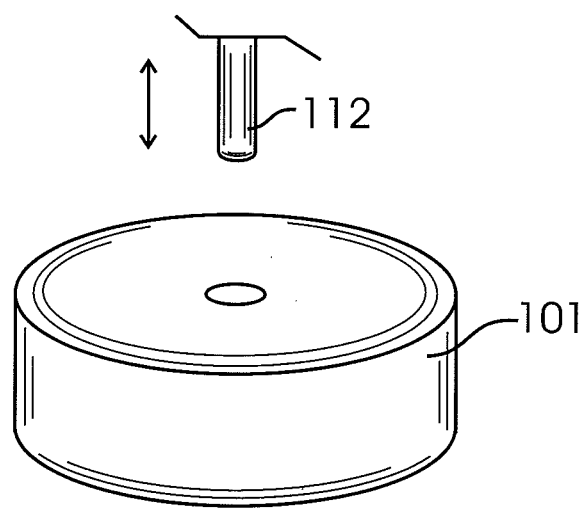
FIG. 8A illustrates a heater element through which a spindle passes.
Figure 8B:
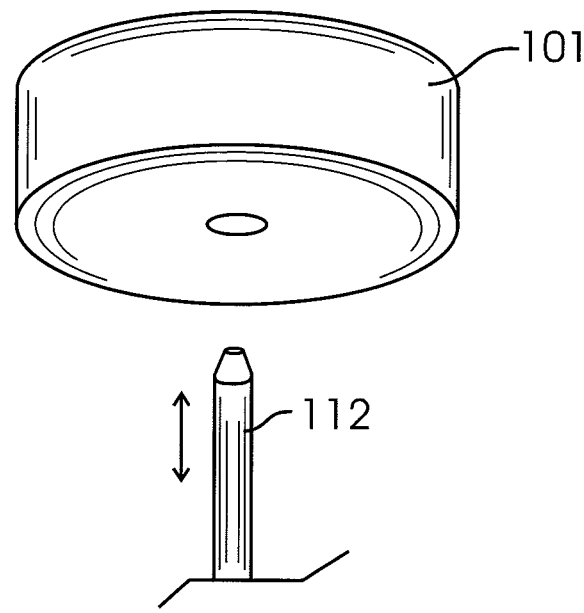
FIG. 8B illustrates a heater element through which a spindle partially passes.

As stated above, the substrate support member 110 is at least partially contained in a heater chamber 10 that is used during thin-film formation. In one aspect of the invention, the heater chamber 10 contains a pocket heater 100 that is a near-blackbody radiator. The pocket heater 100 may include one or more heating elements 101 (e.g., zones) and a slot 10b (as shown in FIGS. 7A and 7B) contained therein through which a substrate support member 110 may be inserted and retracted via a transfer mechanism (e.g., a transfer arm). The spindle 112 may then be extended from either above or below the heater 100 in order to support and rotate the substrate support member 110. FIGS. 8A and 8B illustrate two exemplary embodiments wherein the spindle 112 passes through a heating element in the heater chamber 10.

The above arrangement permits the substrate support member 110 to be introduced into and removed from the heater in one direction, for example, as shown in FIG. 7A. Alternatively, as shown in the embodiment in FIG. 7B, the substrate support member 110 may be introduced into and removed from the heater in multiple directions (e.g., from the sides) by use of a longer slot 10(b).

During the thin film formation process, there may be a minimum temperature above which the substrate support member 110 cannot be removed from the heater chamber 10. This may be because the substrate support member 110 is too hot or because the films being deposited (e.g., (RE)BCO) are too far above their structural phase transition temperature to be removed from the heater chamber 10. Consequently, if the substrate support member 110 remains in close proximity to the heater element 101, the cooldown time of the substrates 116 (e.g., wafers) will be limited to that of the heater element 101. Because the substrate support member 110 should be heated uniformly, the heater element 101 is generally large and requires a long cooldown time. The overall cooldown time may be reduced by using cooling coils or the like to extract heat contained in the heater element 101 and substrate support member 110. Even using cooling devices such as coils and the like, the cooldown time of the substrate support member 110 and associated substrates 116 is limited by the heater components. Ideally, the substrate support member 110 and substrates 116 may be rapidly cooled by physically separating the substrate support member 110 (and substrates 116) from the heater element 101.

Figure 9:
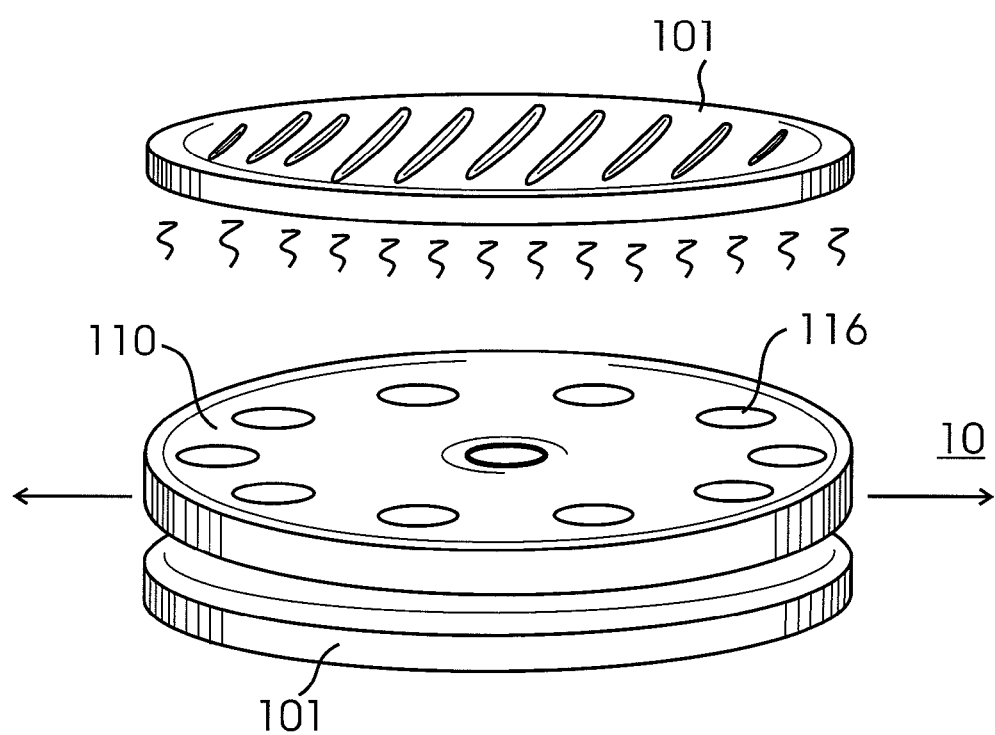
FIG. 9 illustrates a substrate support member interposed between a lower heater plate (e.g., zone) and an upper heater plate (e.g., zone).

When a pocket heater 100 is used in the heater chamber 10, the substrate support member 110 should be located close to the oxygen pocket region because a small gap is required to be maintained near the oxygen pocket. In one embodiment, the oxygen pocket region may be formed integral with a lower heater zone or element. In such case, the top and/or side heater zones may be located farther from the substrate support member 110 as is shown, for example, in FIG. 9 (showing top zone disposed some distance from substrate support member 110). Such arrangement allows passage of the substrate support member 110 into and out of the heater and heater chamber 10. However, the heater zones would have to be hotter than the desired substrate 116 temperature since the heater 100 is no longer acting as a blackbody radiator. If the oxygen pocket is not heated directly, the heating element(s) 101 would have to be far hotter than the desired temperature of the substrates 116 which may make the design complicated and impractical.

In one aspect of the invention, a solution is proposed to physically separate the heater element(s) 101 from the substrate support member 110 following deposition of a thin film. This may be accomplished by moving the heating element(s) 101 away from the substrate support member 110 or alternatively, moving the substrate support member 110 away from the heating element(s) 101. Advantageously, the substrate support member 110 may be removed from the heating element(s) 101 so that it can be freely or actively cooled in oxygen. Moreover, by moving the substrate support member 110 relative to the heating element(s) 101 (or vice versa) this aids in the transfer of the substrate support member 110 (and associated substrates 116) into and out of the deposition chamber (e.g., heater chamber 10).

Assuming that the pocket heater 100 is or approximates a blackbody-type oven, FIGS. 10A-E, 11, and 12 illustrate several exemplary ways of moving the heating element(s) 101 relative to the substrate support member 110. Generally, the embodiments shown in FIGS. 10A-E, 11, and 12 permit the substrate support member 110 to move in the vertical direction (i.e., raised) from a heater element 101 from either above or below and also to be moved horizontally out of the heater chamber 10. FIG. 10A, for example, illustrates an embodiment in which the heating elements 101 (e.g., top and side heating zones, or top, side, and lower heating zones) are separated into two halves by movement of each respective half in the direction of arrows A and B. FIG. 10B illustrates an embodiment in which a vertical hinge 107 is provided that permits the two halves to open. FIG. 10C illustrates an embodiment in which a horizontally positioned hinge 107 permits the opening of the top and side heater elements 101. FIG. 10D illustrates an embodiment wherein a horizontally positioned hinge 107 permits the top heater element 101 or zone to flip open with respect to the remaining heater element 101 (e.g. side heater element). In yet another embodiment, as shown in FIG. 10E, a vertical hinge 107 permits the top heater element 101 to pivot or swing with respect to the remaining heater element(s) 101.

Figure 11:
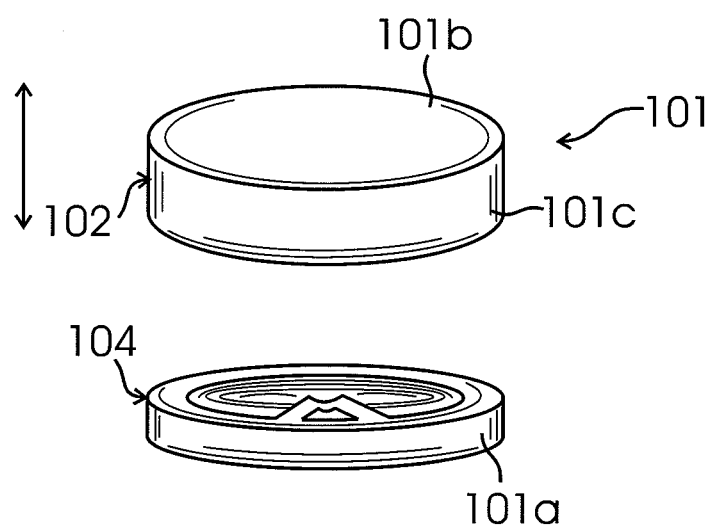
FIG. 11 illustrates an embodiment of a heater element that is moveable with respect to a lower heater plate.
Figure 12:
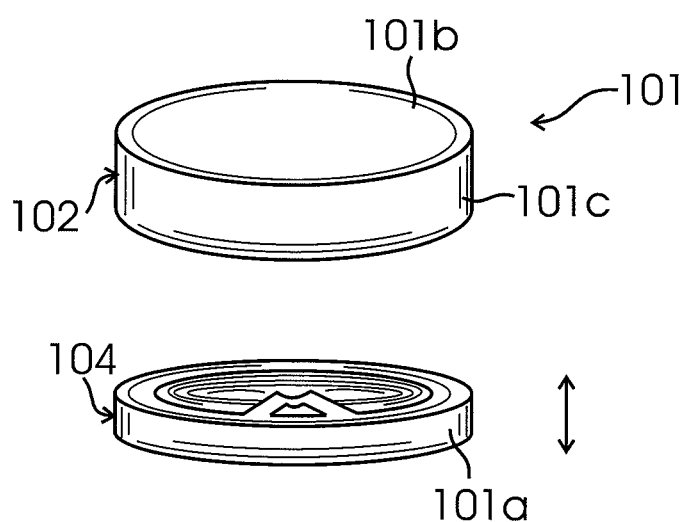
FIG. 12 illustrates an embodiment of a lower heater plate that is moveable with respect to a stationary heater element.
Figure 13:
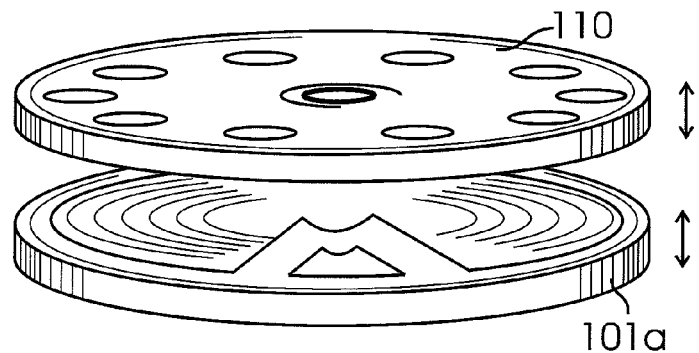
FIG. 13 illustrates a substrate support member and a lower heater plate that are moveable with respect to one another.

FIGS. 11 and 12 illustrate additional embodiments in which the heater element 101 includes a bottom heater element or zone 101a (e.g., lower heater plate) and two upper heater elements or zones 101b, 101c (e.g., heater cap). In one aspect, as shown in FIG. 11, the two upper heater zones 101b, 101c are moved vertically with respect to the lower heater zone 101a, thereby enabling separation of the heater element 101 from the substrate support member 110 contained therein (not shown in FIGS. 11 and 12). In still another embodiment, as shown in FIG. 12, the upper heater zones 101b, 101c remain fixed and the lower heater zone 101a is moveable in a vertical direction. FIG. 13 illustrates a heater element 101a that is moveable with respect to a moveable substrate support member 110. This heater element 101a may or may not incorporate an oxygen pocket.

Figure 14:
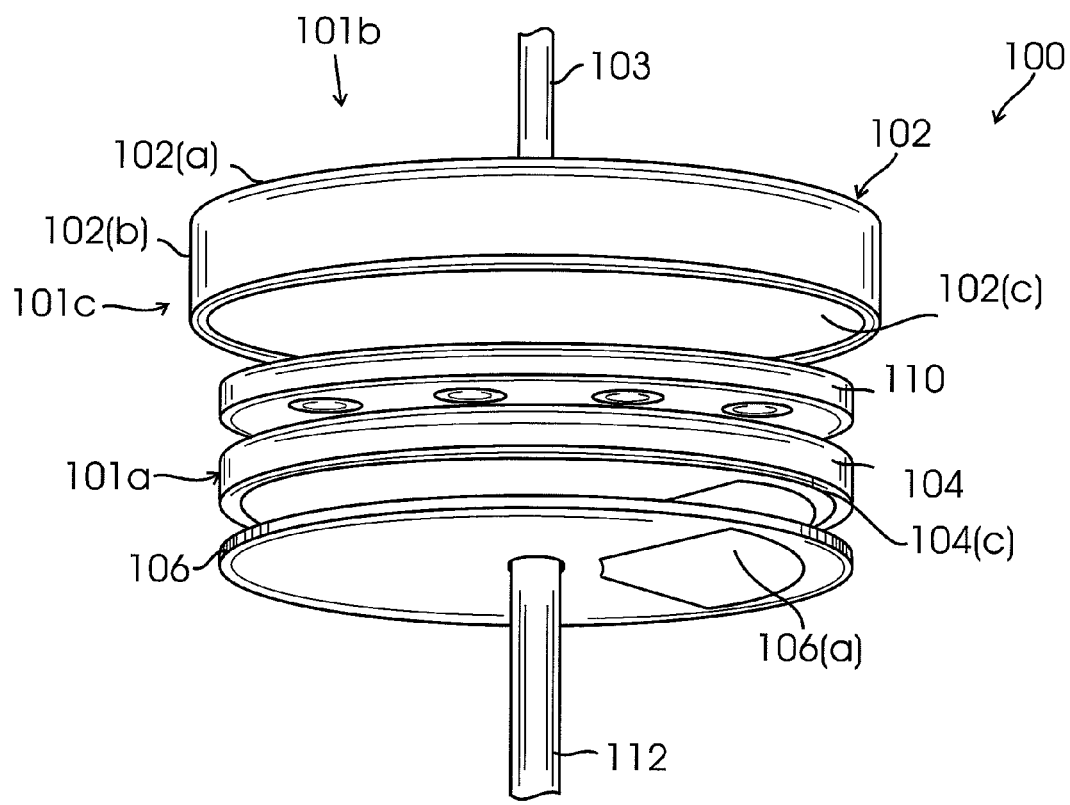
FIG. 14 illustrates a partially exploded view of the pocket heater used inside the heater chamber of the device shown in FIG. 1.

In one aspect of the invention, the heater chamber 10 contains a rotationally driven pocket heater 100 which is used to deposit and/or grow multi-component HTS oxide thin films. FIG. 14 illustrates the various components used for the pocket heater 100. The pocket heater 100 includes heated cap portion 102 (e.g., upper heating zone 101b as shown in FIGS. 11 and 12) which includes a circular upper plate surface 102(a) and a downwardly projecting cylindrical side wall 102(b) (heating zone 101c as shown in FIGS. 11 and 12) which forms an interior portion 102(c) into which various components of the pocket heater 100 are inserted (described below). The heated cap portion 102 may be fabricated from insulated heater wire (heating element) that is wrapped to form the upper surface 102(a) and the cylindrical side 102(b) wall. Preferably, the upper surface 102(a) and the cylindrical side wall 102(b) each are formed from a single segment of insulated wire such that the upper surface 102(a) and cylindrical side wall 102(b) may be heated independently of one another for temperature uniformity. Current is run through the insulated wires to generate heat.

The heated cap portion 102 of the pocket heater 100 is advantageously moveable in the z-direction to open the pocket heater 100 so that the substrate support member 110 (described below) can be loaded into the pocket heater 100 prior to thin-film deposition and removed after deposition. The heated cap portion 102 is, for instance, secured to an actuator 103 which extends through a top wall of the heater chamber as is seen in FIG. 1. The actuator 103 provides the vertical movement (i.e., motion in the z-direction) to the heated cap portion 102 of the pocket heater 100.

Figure 15:
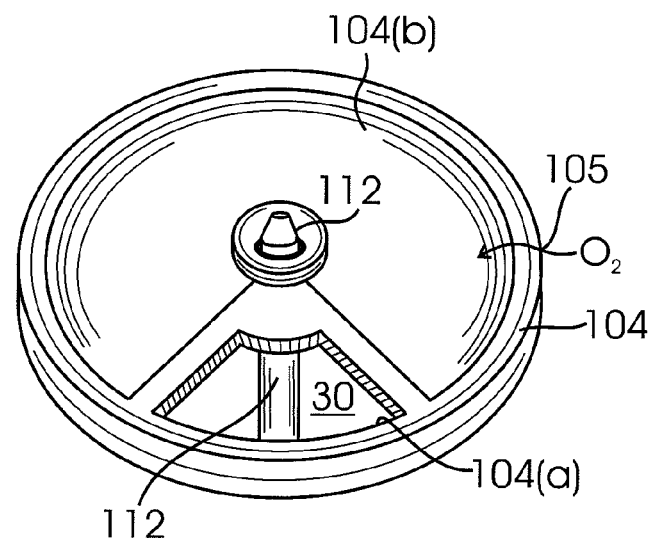
FIG. 15 illustrates the top side of the lower plate heater portion of the pocket heater. The oxygen pocket and window passing through to the source chamber are illustrated.

Referring to FIGS. 14 and FIG. 15, in one aspect of the device, the pocket heater 100 includes a lower heater plate 104 (e.g., lower heater zone 101a as shown in FIGS. 11 and 12) which is a third, independent heating zone. The lower plate heater 104 is stationary and may be anchored to the top, bottom, or side walls of the heater chamber 10. The lower heater plate 104 is preferably formed from a single piece of metal, preferably INCONEL, that is machined into the desired shape. Of course, the heater plate 104 may be formed from other materials. The lower plate heater 104 is machined to include a window opening 104(a) (best seen in FIG. 15) which passes completely through the plate and is exposed to the source chamber 30 and source flux contained therein.

The lower plate heater 104 further includes a pocket 104(b) (as best seen in FIG. 15) which is machined into the upper surface of the lower plate heater 104. During operation of the device 2, for example, oxygen ($O_2$) gas is introduced into the pocket 104(b) for the reaction portion of thin-film growth/deposition. The oxygen gas is introduced into the pocket 104(b) by one or more ports 105. The underside of the lower plate heater 104(c) includes a pocket (not shown) into which is brazed insulated thermal wiring. Current is run through this wiring to heat the lower plate heater 104. U.S. Pat. No. 5,126,533, which is incorporated by reference as if set forth fully herein, discloses a method of brazing insulated wire to form a heater of this type.

Figure 16A:
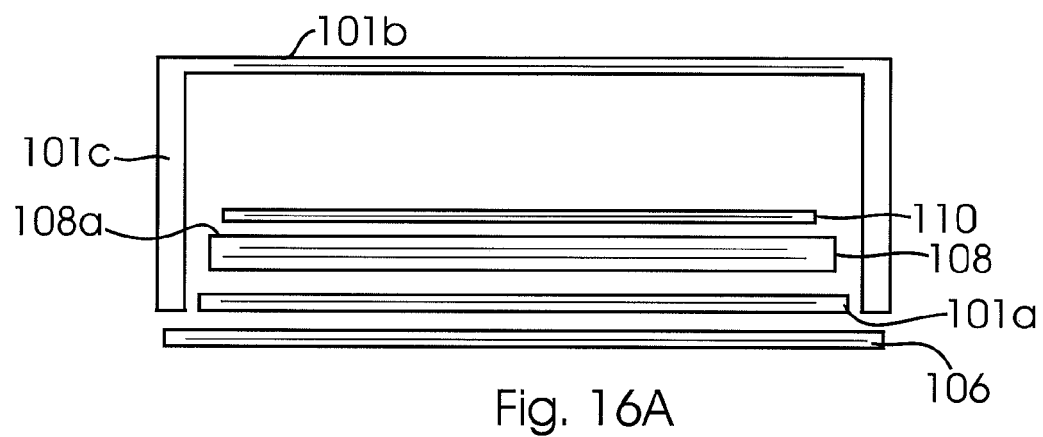
FIG. 16A illustrates a side view of an alternative embodiment of the pocket heater used inside the heater chamber of the device shown in FIG. 1.
Figure 16B:
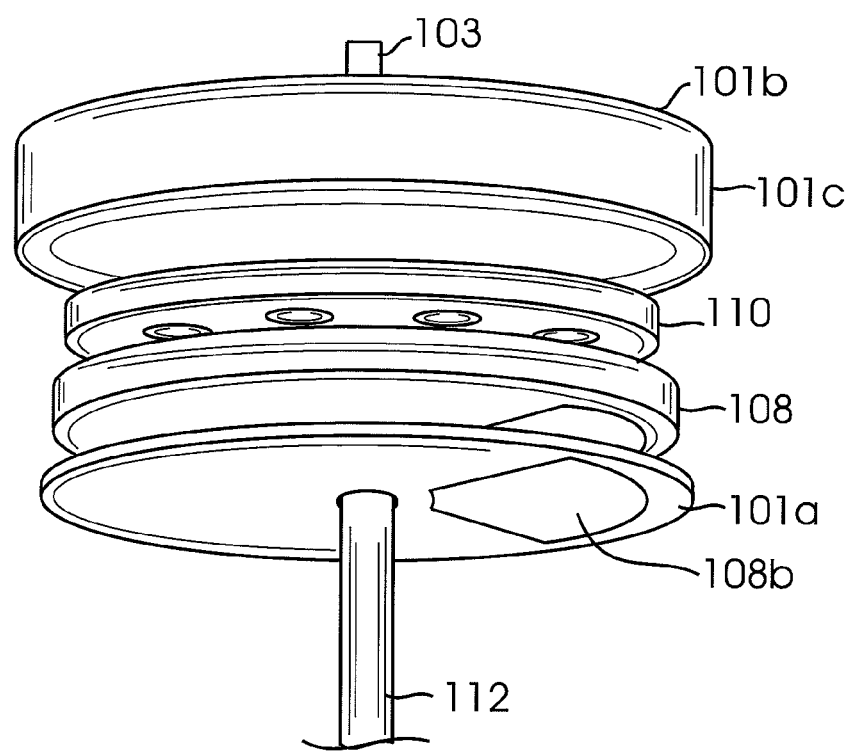
FIG. 16B illustrates a bottom, perspective view of the pocket heater illustrated in FIG. 16A.

Alternatively, a wholly separate oxygen pocket member 108 may exist independent of the lower heater zone. The oxygen pocket member 108 includes an oxygen pocket 108a that may not be part of the lower heater zone, as shown, for example, in FIGS. 16A and 16B. Thus, the oxygen pocket member 108 may or may not contain heating elements. Generally, the purpose of the oxygen pocket 108a is to provide a localized region of oxygen adjacent to the substrates for film oxidation. In this arrangement, the oxygen pocket member 108 and substrate support member 110 both are contained within the quasi-blackbody heater, the heating elements of which may surround both the oxygen pocket member 108 and support plate on multiple or all sides. The oxygen pocket member 108 is preferably formed from a single piece of metal, such as, for example, INCONEL, that is machined into the desired shape. Of course, the oxygen pocket member 108 may be formed from other materials. The oxygen pocket member 108 is machined to include a window opening 108b which passes completely through the member 108 and is exposed to the source chamber 30 and source flux contained therein. In this embodiment, the lower heater zone 101a may be fabricated from insulated heater wire (heating element) that is wrapped. The lower heater zone 101a may be formed from a single segment of insulated wire such that the lower heater zone 101a, and heater zones 101b, 101c may be heated independently of one another for temperature uniformity.

Referring back to FIG. 14 and FIG. 16A, the pocket heater 100 preferably includes a heat shield 106 disposed beneath the lower plate heater 101a. As seen in FIG. 14, the heat shield 106 includes a window 106(a) therein which provides access to the window opening 104(a) of the lower plate heater 104 and to the source chamber 30 containing the source of flux.

With reference now to FIGS. 17A, 17B, 18, 19A, 19B, 19C, 20A, 20B, 21A, 21B, 22, and 23, a z-adjust assembly 121 is provided to adjust the gap between the rotating substrate support member 110 and the oxygen pocket 104(b) which may exist in the lower plate heater 104 (as shown, for example, in FIGS. 14 and 15) or as part of a separate oxygen pocket member 108. The width of the gap is important in order to maintain a high differential pressure between the oxygen pocket 104b, 108a and the deposition chamber. A small and uniform gap is desirable because it maximizes the oxygen pressure in the pocket 104b, 108a while minimizing any leakage of oxygen out of the pocket 104b, 108a. In addition, a small and uniform gap minimizes the background pressure in the deposition chamber. The size of the gap depends on the temperature of the lower plate heater 104 or of the oxygen pocket member 108 and the substrate support member 110 as well as their respective thermal histories. These components expand and contract as a function of temperature and they also distort to different degrees depending on the temperature profile and heater ramp cycle.

There thus is a need to adjust the gap in situ at any time during the heating cycle and deposition run in order to maintain the optimal gap width. To accomplish this, either the substrate support member 110 (containing the substrates 116) or the lower plate heater 104 or oxygen pocket member 108 need to be able to be adjusted vertically as shown generally in FIG. 13.

Figure 17A:
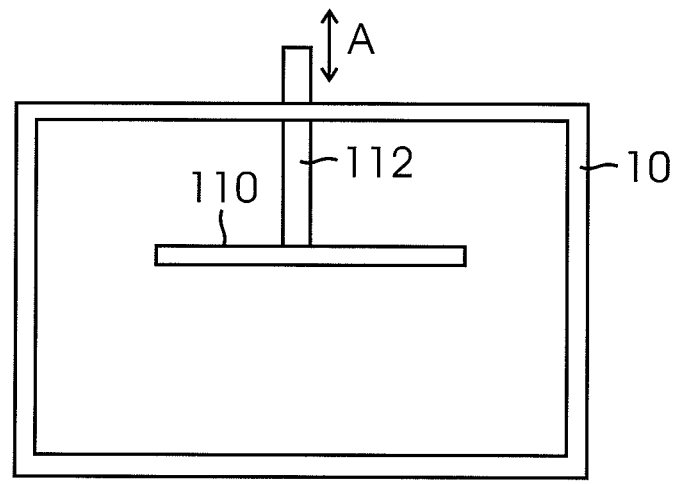
FIG. 17A illustrates a vertically oriented spindle holding a substrate support member wherein the spindle passes through the top of a deposition chamber.
Figure 17B:
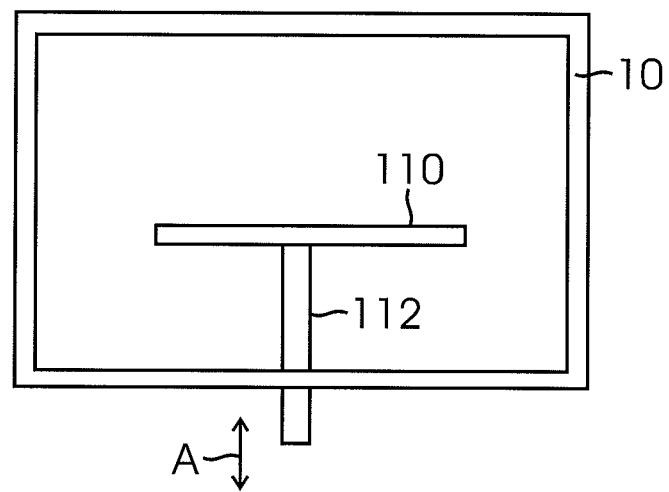
FIG. 17B illustrates a vertically oriented spindle holding a substrate support member wherein the spindle passes through the bottom of a deposition chamber.

In one aspect of the invention, the lower plate heater 104 or oxygen pocket member 108 is vertically adjusted through the use of cams, scissors, jack screws, lead screws, servos, and other mechanisms known to those skilled in the art. In another embodiment, the substrate support member 110 is vertically adjusted by vertical movement of the spindle 112 as is shown, for example, in FIGS. 17A, 17B, 18, 19A, 19B, 19C, 20A, 20B, 21A, 21B, 22, and 23. FIG. 17A illustrates a z-adjustable spindle 112 that holds the substrate support member 110 from the top and extends through the top of the heater chamber 10. The spindle 112 may be connected or coupled to a motor (not shown) to rotationally drive the spindle 112 and substrate support member 110. The spindle 112 may be adjusted in the vertical direction (arrow A) by using a linear vacuum feedthrough or linear slide (or other compatible z-adjust mechanisms). FIG. 17B illustrates an embodiment in which the spindle 112 holds the substrate support member 110 from below and extends through the bottom of the heater chamber 10. The spindle 112 may be rotationally driven and raised/lowered in the direction of arrow A.

Figure 18:
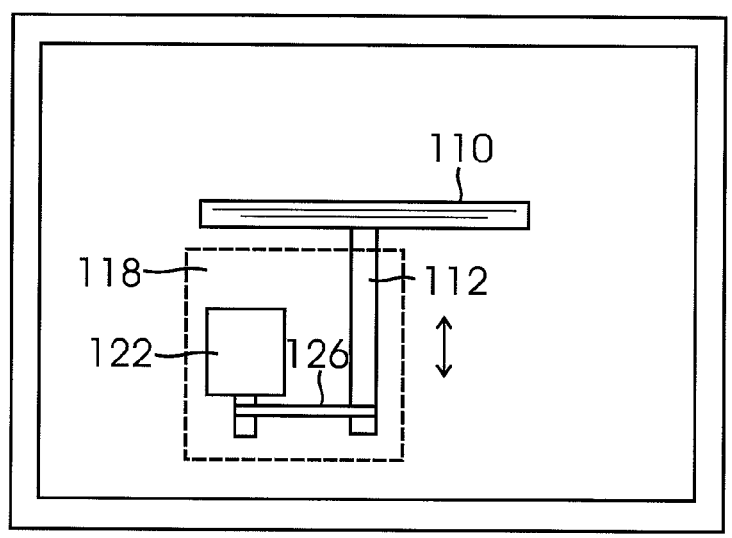
FIG. 18 illustrates an embodiment of a z-adjust assembly wherein the motor and spindle are movable as a single unit.

In one aspect of the invention, as shown in FIG. 18, the entire spindle 112 is located inside the deposition chamber (i.e., heater chamber 10) and is driven via an in-vacuum motor assembly such as in-vacuum motor 122 described in more detail below.

Figure 19B:
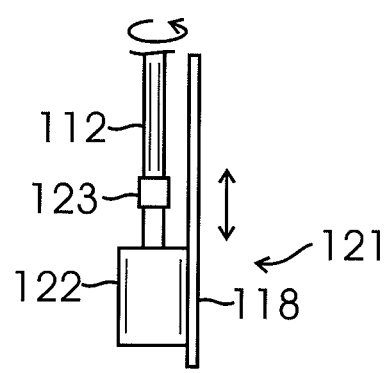
FIG. 19B illustrates a side view of the z-adjust device of FIG. 19A.

The spindle 112 may be moved separately from the in-vacuum motor 122 if suitable coupling mechanisms are employed. Preferably, as disclosed below, the motor 122 and spindle 112 are moved together as a unit. FIGS. 19A and 19B illustrate an embodiment wherein a shaft of the motor 122 is coupled via coupler 123 to the spindle 112. The motor 122 is secured or otherwise attached to a vertically oriented support plate 118. FIG. 19C illustrates an alternative embodiment in which the in-vacuum motor 122 is secured to the spindle 112 via a belt 126 or the like.

Figure 20A:
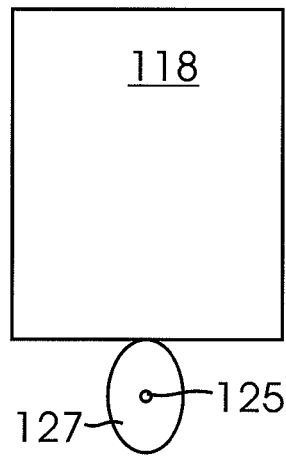
FIG. 20A illustrates a front view of a z-adjust device that uses a horizontal feedthrough and an elliptically-shaped cam.
Figure 20B:
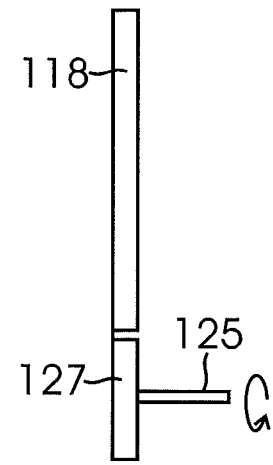
FIG. 20B illustrates a side view of the z-adjust device of FIG. 20A.
Figure 21A:
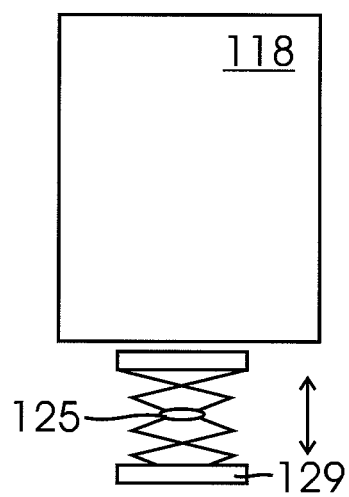
FIG. 21A illustrates a front view of a z-adjust device that uses a horizontally-oriented rotary feedthrough that drives a scissor jack device to raise and lower a vertically oriented support plate.
Figure 21B:
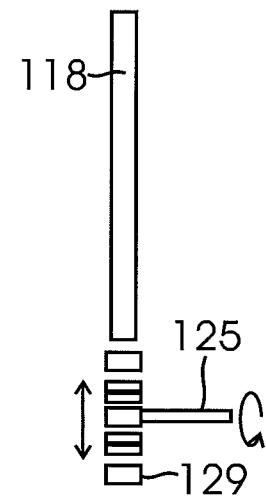
FIG. 21B illustrates a side view of the z-adjust device of FIG. 21A.
Figure 22:
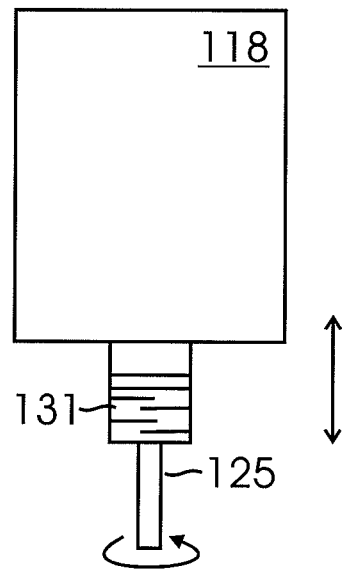
FIG. 22 illustrates a z-adjust device that uses a vertically-oriented rotary feedthrough driving a jack screw.
Figure 23:
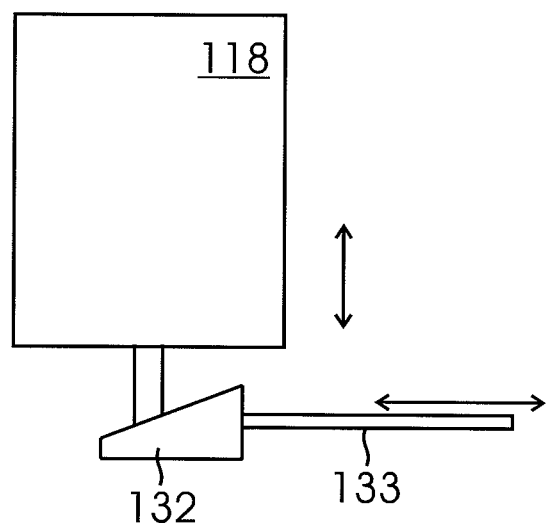
FIG. 23 illustrates a z-adjust device that uses a horizontal feedthrough and cam to raise and lower the vertically-oriented support plate.

FIGS. 20A and 20B illustrate an embodiment in which a rotary shaft 125 drives a rotatable cam 127 that moves a vertically oriented support plate 118. FIGS. 21A and 21B illustrate a horizontally-oriented rotary shaft 125 that drives a scissor jack device 129. FIG. 22 illustrates a vertically-oriented rotary shaft 125 driving a jack screw 131. In another embodiment, as shown for example in FIG. 23, a linear feed-through 133 drives a cam 132 that engages the vertically oriented support plate 118. In still another aspect of the invention, a second in-vacuum motor (not shown) may be used to drive the shaft/feedthrough (125, 133) and cam (127, 133), thereby minimizing the number of feedthroughs into the vacuum chamber.

Figure 24:
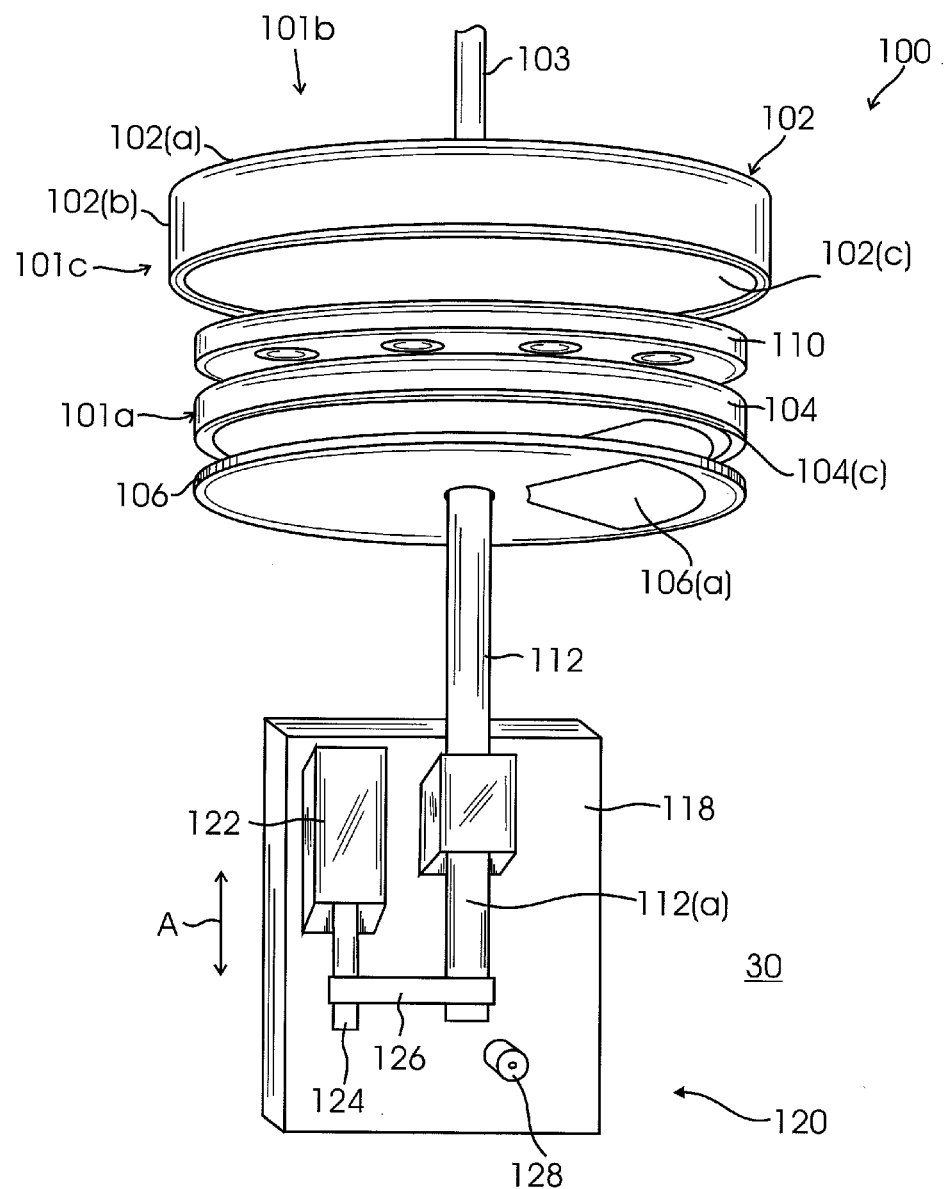
FIG. 24 illustrates the spindle shaft and motor assembly located on a vertical support plate.
Figure 25:
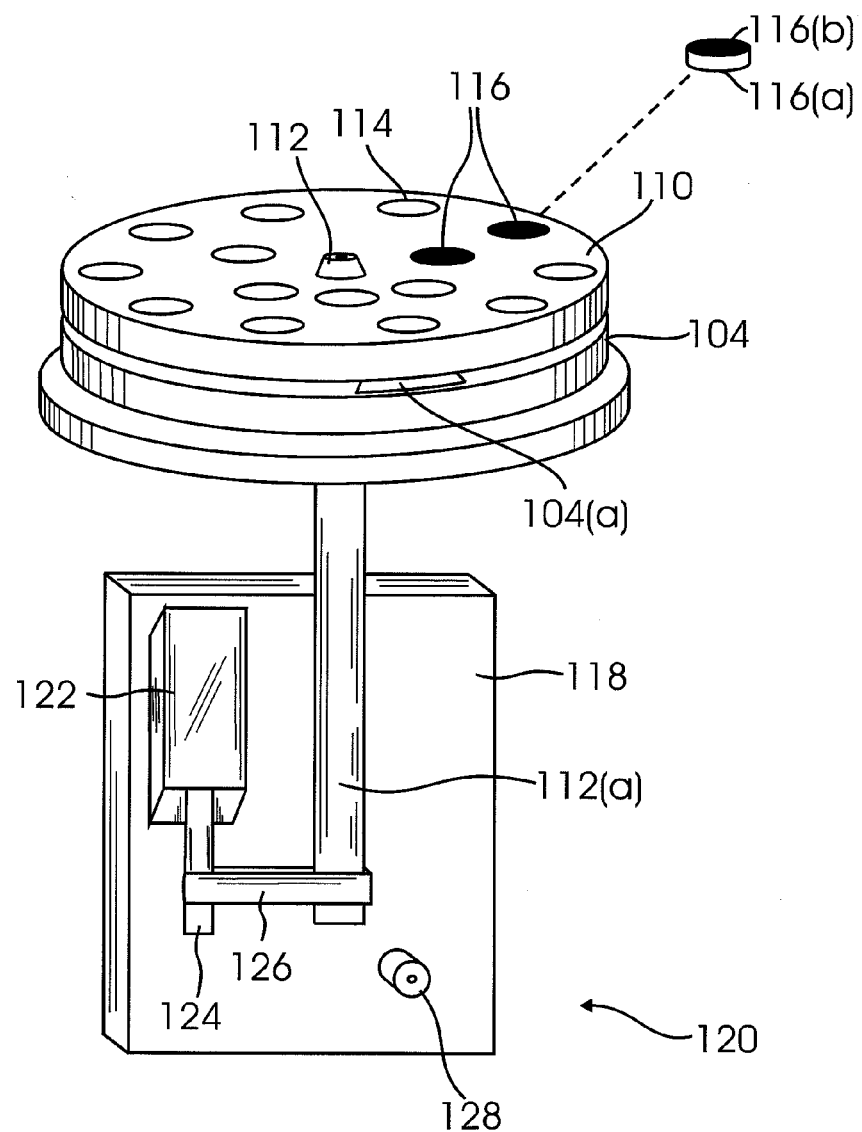
FIG. 25 illustrates a substrate support member containing substrates loaded on top of the lower plate heater.

Referring to FIG. 24 and FIG. 25, in one preferred aspect of the invention, a vertically oriented support plate 118 contains the spindle shaft and motor assembly 120 (z-adjust assembly). The support plate 118 is moveable in the z-direction as shown, for example, by arrow A in FIG. 24. The spindle shaft and motor assembly 120 includes a motor 122 (preferably an in-vacuum motor 122) affixed to the support plate 118. The in-vacuum motor 122 includes a drive shaft 124 that is mechanically coupled to the spindle shaft 112(a) via a belt 126 or other linkage assembly. The in-vacuum motor 122 provides variable speed rotation to the substrate support member 110. The support plate 118 further includes a roller 128 that is used to move the spindle shaft and motor assembly 120 in the z-direction (explained in more detail below). In an alternative configuration, the motor assembly 120 may be provided ex-situ rather than in-situ.

Referring to FIG. 24 and FIG. 25, in one aspect of the invention, the substrate support member 110 is held between the upper heater zones 101b, 101c of the pocket heater 100 and the lower heater zone 101a. The spindle 112 passes through center holes located in the heat shield 106 and lower plate heater 104. The spindle 112 is rotatably coupled to a motor (described in more detail below) and is also movable in the z direction as shown by arrow A in FIG. 24.

FIG. 25 illustrates a substrate support member 110 held on the rotatable spindle 112. The substrate support member 110 is preferably held gravitationally on an upper end of the spindle 112. The substrate support member 110 includes a plurality of holes 114 cut into the substrate support member 110 that accept and hold substrates 116 onto which the HTS material is deposited. The substrates 116 may include substrates formed from, for example, magnesium oxide (MgO). Other materials may, of course, be used in accordance with the invention described herein. The substrates 116 are preferably gravitationally held in place by small fingers or a ridge located along the lower edge of the substrate support member 110 where the holes 114 are located. Thus, the substrate support member 110 allows for essentially contactless suspension of the substrates 116 during the heating and deposition process.

In addition, this configuration permits the growth and/or deposition of HTS thin films on a single side of the substrate 116, namely, the lower side of the substrates 116(a) as seen in FIG. 25. The upper side (or backside) of the substrates 116(b) is undisturbed and may be deposited in a subsequent deposition process by turning the substrate 116 over.

The substrate support member 110 may be designed to accommodate a smaller number of larger diameter substrates 116 or a larger number of smaller diameter substrates 116. In addition, the holes 114 in the substrate support member may also be designed to accommodate substrates 116 having different shapes.

The device 2 advantageously permits the substrate support member 110 to be introduced into the heater chamber 10 in situ when the pocket heater 100 is opened, i.e., when the heated cap portion 102 is raised from the lower heater plate 104. The heated cap portion 102 is then lowered over and around the substrate support member 110 during the run and can then be raised at the end of the run or at such time when the pocket heater 100 has cooled sufficiently. This ability to open the pocket heater 100 and load/unload the substrate support member 100 improves the cycle time of the deposition process because the substrate support member 110 does not have to be attached to the pocket heater 100 when the pocket heater 100 is cold. Rather, the substrate support member 110 can be loaded/unloaded after the pocket heater 100 is only partway through its heat-up and cool-down cycle.

In an alternative embodiment, the substrate support member 110 allows for gripping the substrates 116 from both the lower 116(a) and upper surfaces 116(b) of the substrates simultaneously such that the entire substrate support member 110 may be flipped over between deposition runs. Preferably, the substrate support member 110 can be flipped over in-situ within the heater chamber 10 or within the transfer chambers 40, 50 such that HTS material can be deposited onto the second side of the substrate 116 (e.g., the upper side 116(b)) without having to break vacuum in the device 2, thereby significantly increasing the throughput of the device 2 and process. In this embodiment, the transfer arm 45 may be rotatable about its long axis to flip the substrate support member 110 from one side to another.

Figure 26:
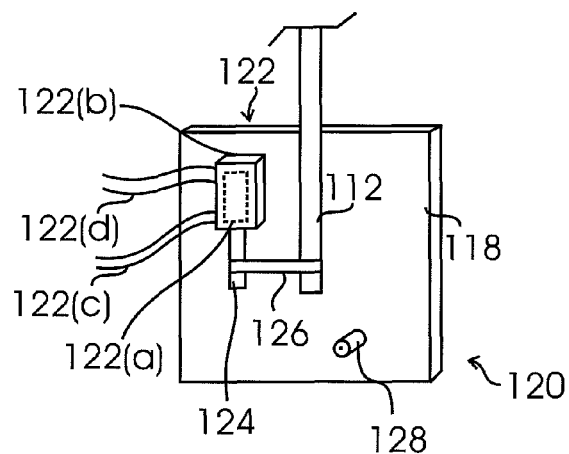
FIG. 26 illustrates the spindle shaft and motor assembly located on a vertical support plate.

FIG. 26 illustrates the in-vacuum motor 122 used in accordance with a preferred aspect of the invention. The in-vacuum motor 122 includes a motor 122(a) housed inside an enclosed pressure vessel 122(b). The pressure vessel 122(b) effectively isolates the motor 122(a) from the vacuum conditions inside the heater chamber 10. The drive shaft 124 extends from the interior of the pressure vessel 122(b) to the outside of the pressure vessel 122(b) via a vacuum feedthrough (not shown). A pressure line 122(c) is secured to the pressure vessel 122(b) and delivers pressurized dry air inside the space of the pressure vessel 122(b) surrounding the motor 122(a). The pressurized dry air removes heat from the motor 122(a). Another conduit 122(d) is coupled to the pressure vessel 122(b) for delivering power and other control wires needed to operate the motor 122(a).

In an alternative embodiment, the motor 122 may include an air or gas-driven motor which is powered by a source of compressed or otherwise pressured source of air or gas. Mechanical, electrical, or even optical feedback may be employed for speed control of the motor 122.

Figure 27:
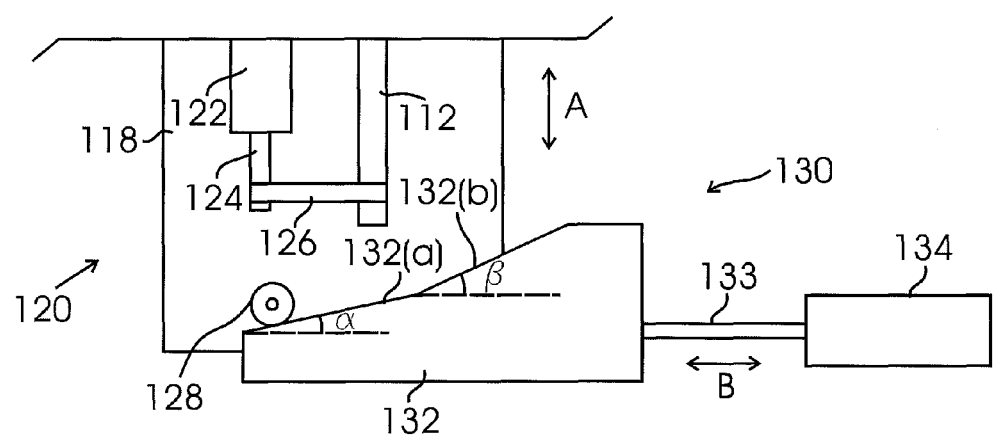
FIG. 27 illustrates a cam device used to raise and lower the spindle shaft and motor assembly shown in FIG. 26.

FIG. 27 illustrates an exemplary cam device 130 used to impart z-direction movement (arrow A in FIG. 27) in the spindle shaft and motor assembly 120. The cam device 130 includes a cam 132 having multiple inclined surfaces 132(a) and 132(b) for engaging with the roller 128 secured to the support plate 118. Preferably, the cam 132 is machined from a solid piece of stainless steel plate. First inclined surface 132(a) is inclined at an angle α while the second inclined surface 132(b) is inclined at an angle β. Preferably, angle β is greater than angle α. The different angles permit rough and fine course adjustments of the z-direction of the spindle shaft and motor assembly 120. In an alternative configuration, the cam 132 may have a surface in the form of a continuous or semi-continuous arc (not shown).

The cam 132 is moveable in the horizontal direction (arrow B in FIG. 27) by an actuator 134 which is connected to the cam 132 via a feed-through 133. Preferably, the actuator 134 is located external to the heater chamber 10 and includes a feed-through 133 passing through a side wall of the heater chamber 10. The movement of the actuator 134 is preferably controlled by a computer 200 (See FIG. 34) or microprocessor which allows dynamic movement of the spindle 112 (and thus substrate support member 110) in real time during the deposition process. In this regard, the gap between the substrate support member 110 holding the substrates 116 and the lower heater plate 104 can be optimized.

During operation of the device 2, the second inclined surface 132(b), that is the surface with the steeper inclination, is used when the substrate support member 110 needs to be raised and lowered from the lower heater plate 104 for purposes of loading and unloading and for separating the support member 110 from the heater assembly. In contrast, the first inclined surface 132(a), namely, the surface with the shallower inclination, is used to allow fine z-axis adjustment of the substrate support member 110 for placing the substrate support member 110 as close as possible to the lower heater plate 104, thereby adjusting the gap between the substrate support member 110 and the lower heater plate 104.

The evaporation rate of metal species used to form HTS thin films should be carefully monitored and controlled in order to produce the desired film composition. While it has been known to use QCMs and associated electronics to monitor this deposition process, these crystals must generally be replaced after every deposition run, particularly because the signals generated by the crystals tend to become noisy from large amounts of deposited materials and oxides. Opening the heater chamber 10 for the purpose of replacing these crystals is undesirable, however, because the large volume of the heater chamber 10 must then be cleaned and pumped again to vacuum. This adversely affects the throughput of the device. The present device 2, however, with the separate monitor chamber 60 allows for the replacement of the deposition monitors 64 (e.g., QCMs) without disturbing the heater chamber 10 (or other chambers).

FIGS. 28A, 28B, 29, 30, 31A, 31B, and 31C illustrate aspects of the monitor chamber 60 in which the QCMs (or other rate, flux, or thickness monitors) are retractable within a load-locked chamber 70 or housing that is differentially pumped. The load-locked chamber is coupled to a source of vacuum 68 to provide the differential pumping aspect. The advantage of this embodiment is that it permits the replacement of QCMs (or other sensors) without breaking vacuum and opening the deposition chamber either during a run or between runs. In addition, the vacuum pumped load-locked chamber 70 minimizes the QCM from oxygen exposure which degrades their rate monitoring abilities.

Figure 28A:
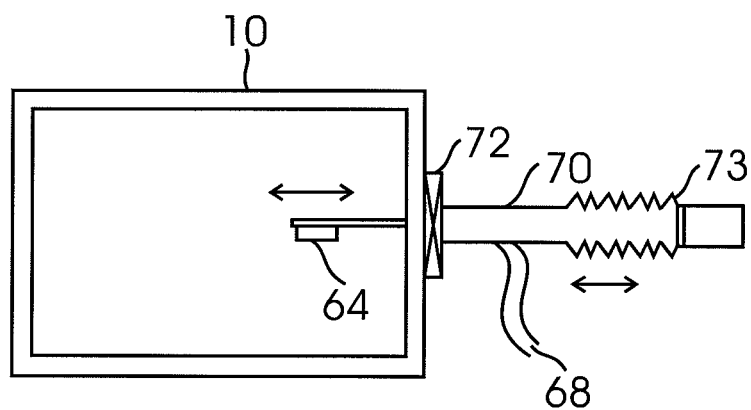
FIG. 28A illustrates one aspect of a load-lock chamber used to store one or more QCMs.
Figure 28B:
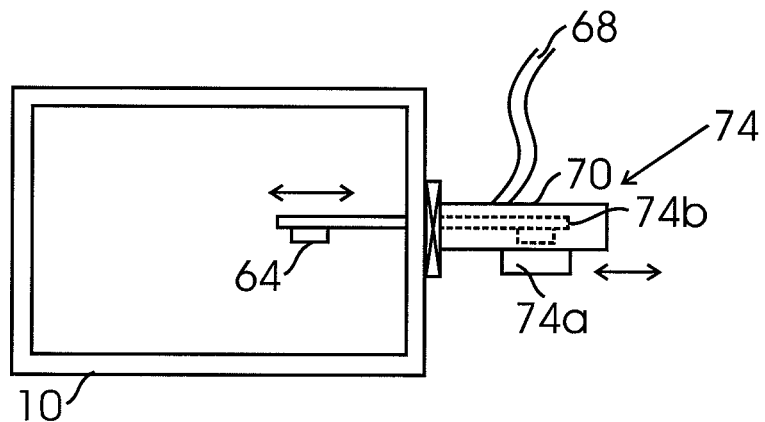
FIG. 28B illustrates another aspect of a load-lock chamber used to store one or more QCMs.
Figure 29:
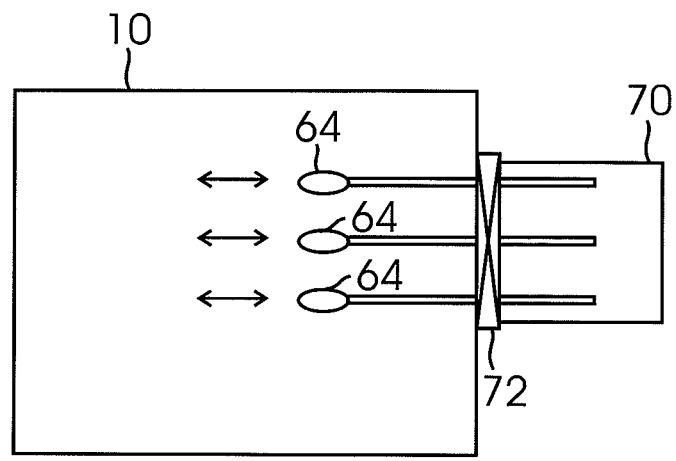
FIG. 29 illustrates a load-lock chamber having three QCMs disposed therein.

FIG. 28A illustrates a load-locked chamber 70 connected to a main deposition chamber (e.g., heater chamber 10). The load-locked chamber 70 includes a valve 72 such as a gate valve to separate the interior of the deposition chamber from the interior of the load-locked chamber 70. As seen in FIG. 28A, a vacuum bellows drive mechanism 73 is used to move the QCMs (sensor(s) 64) laterally into and out of the deposition chamber. FIG. 28B illustrates an alternative aspect of the invention in which the QCMs 64 are moved into and out of the deposition chamber using a magnetically-coupled transfer arm mechanism 74 that includes a moveable external magnet 74a that is used to drive a magnetic transfer 74b arm. FIG. 29 illustrates three QCMs which are retractable within a single load-locked chamber 70 through a valve 72. Alternatively, a separate load-locked chamber 70 may be used for each QCM.

Figure 30:
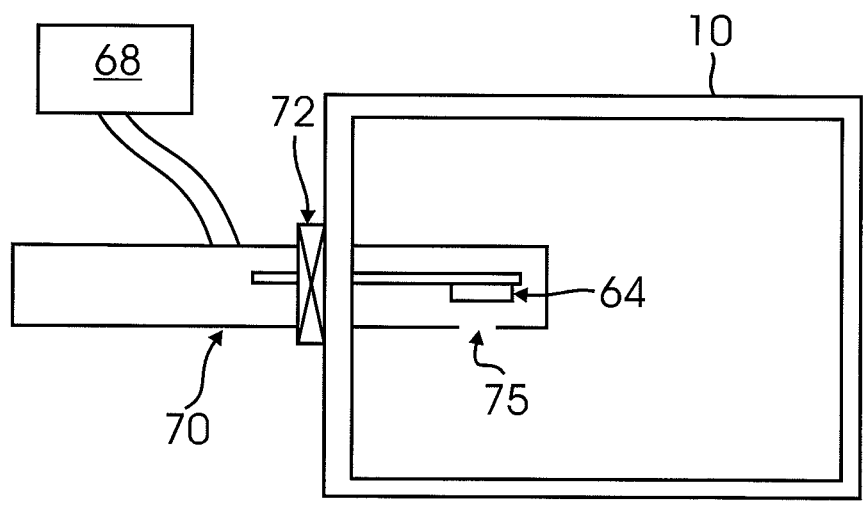
FIG. 30 illustrates another embodiment of a load-lock chamber in which the underside of the chamber includes a hole therein for providing access to the deposition chamber.

FIGS. 30, and 31A-C illustrate an embodiment wherein the load-locked chambers 70 extend into the deposition chamber 10 and are continually pumped using a source of vacuum 68 to reduce the amount of residual oxygen near the QCM heads. FIG. 30, for example, illustrates a load-locked chamber 70 having a slit or hole 75 located on the underside of the chamber 70 such that evaporated species can enter the chamber 70 and be deposited on the QCMs 64. A valve 72 separates the interior of the deposition chamber 10 from the interior of the load-locked chamber 70. Multiple QCMs may be incorporated into a single load-locked chamber 70 (e.g., three QCMs).

Figure 31A:
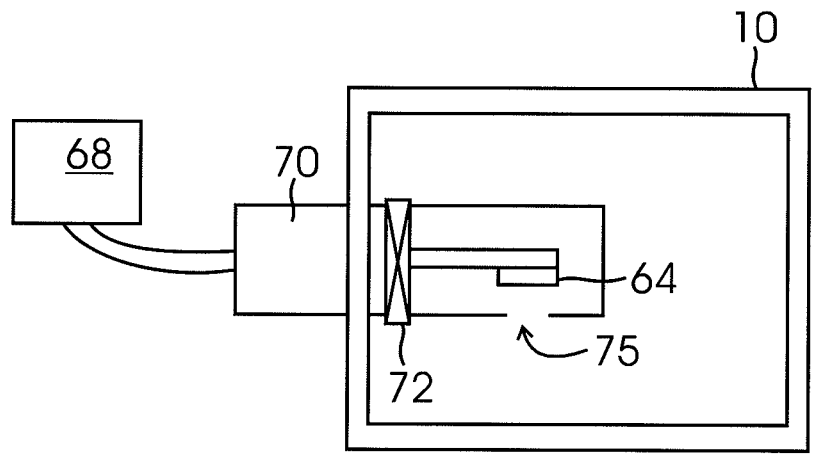
FIG. 31A illustrates another embodiment of a load-lock chamber. The valve to the load-lock chamber is located inside the deposition chamber.
Figure 31B:
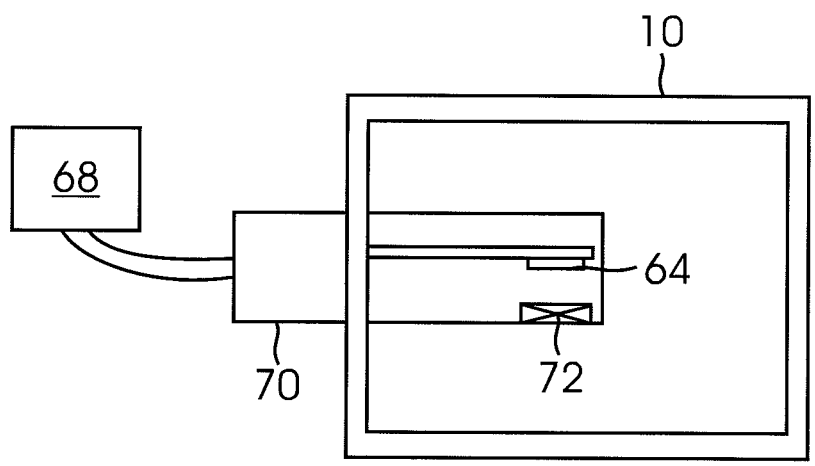
FIG. 31B illustrates another embodiment of a load-lock chamber. The valve is disposed on the underside of the load-lock chamber and provides access to the deposition chamber when opened.
Figure 31C:
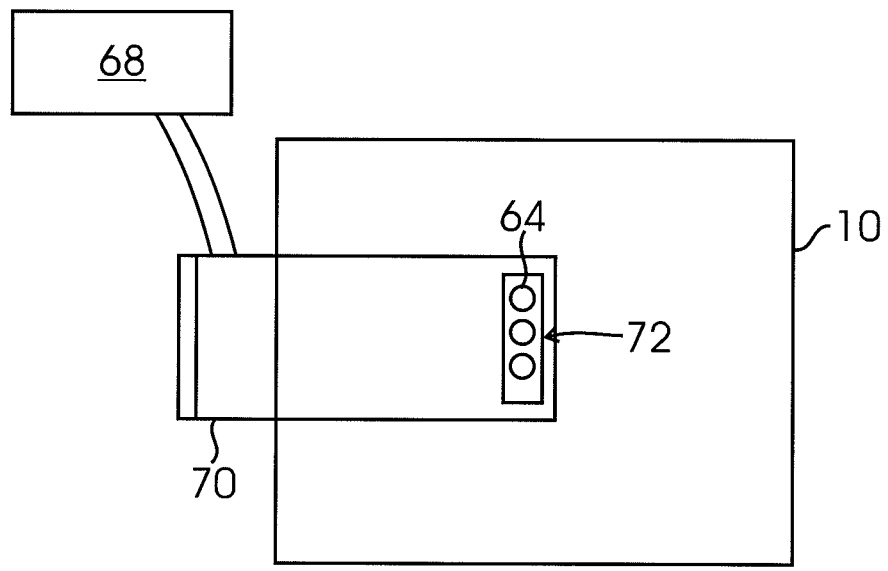
FIG. 31C illustrates a top down view of the load-lock chamber shown in FIG. 31B.

In an alternative embodiment, as shown in FIG. 31A, the valve 72 may be located on the load-locked chamber 70 such that the valve 72 is within or inside the deposition chamber 10. Alternatively, the valve 72 may form the slit itself (e.g., slit valve) as is shown in FIGS. 31B and 31C. By opening the slit valve 72, the evaporated species are then exposed to the QCMs.

Figure 32:
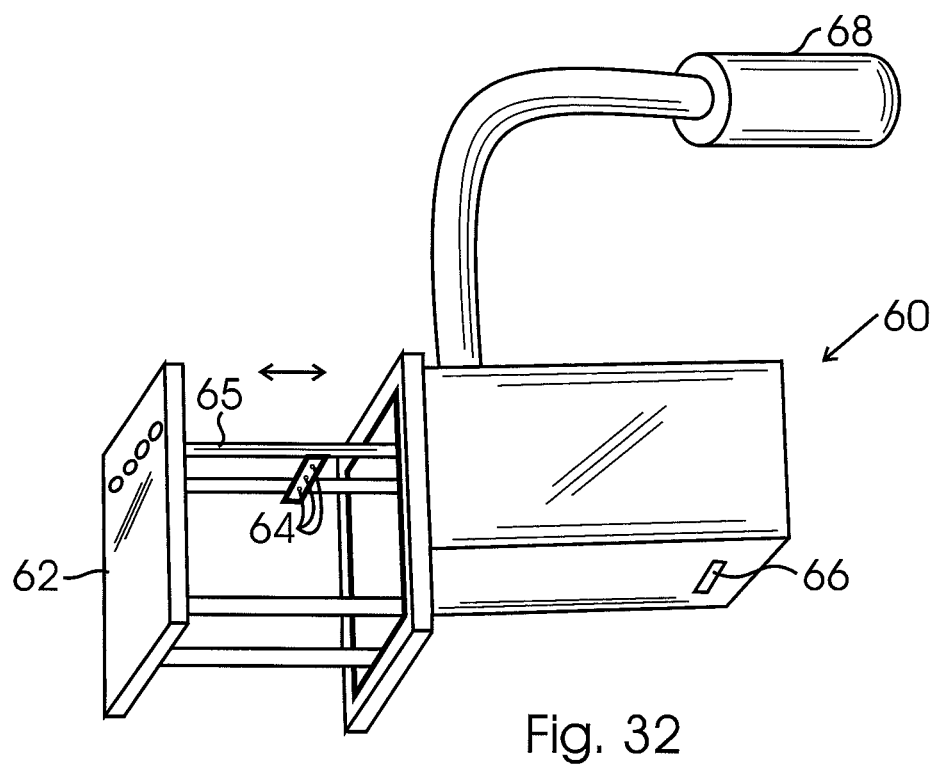
FIG. 32 is a perspective view of the monitor chamber in an open configuration showing the deposition monitors used to monitor the evaporation of source material contained in the source chamber.

The elements of FIG. 31B and 31C are incorporated into one preferred embodiment of the monitor chamber 60 used in connection with the device 2. This preferred embodiment is illustrated in FIG. 32. The monitor chamber 60 includes a front face plate 62 that is slidable within the monitor chamber 60. The slidable front face plate 62 permits easy access to one or more deposition monitors 64 positioned on the rails 65. The deposition monitors 64 are aimed downward toward the source chamber 30 and preferably include dividers or the like (not shown) that direct each monitor 64 to a particular flux source in the source chamber 30. In a preferred aspect of the invention, the deposition monitor 64 is a crystal quartz monitor (QCM).

The deposition monitors 64 are located on the rails 65 such that when the front face plate 62 is closed against the monitor chamber 60, the deposition monitors 64 are disposed above a slit valve 66 located on the underside of the monitor chamber 60. The slit valve 66 opens/closes access to the source chamber 30 containing the flux sources. In this manner, the monitor chamber 30 is load-locked from the source chamber 30 via the slit valve 66.

When the slit valve 66 is open, the deposition monitors 64 are exposed to the evaporated flux that rises from the source chamber 30 into the heater chamber 10, and thus the deposition rate of the flux species may be monitored. When the slit valve 66 is closed, the monitor chamber 60 may be vented to atmosphere separately from the other chambers, and the deposition monitors 64 removed from the monitor chamber 60 using the slidable front face plate 62. In this manner, the deposition monitors 64 may be inspected and replaced without disturbing the rest of the vacuum system.

Still referring to FIG. 32, a vacuum source 68 such as, for example, a vacuum pump, is coupled to the monitor chamber 30 and is used to pump down the monitor chamber 30 during operation of the device 2. The vacuum source 68 is preferably a high vacuum pump such as, for instance, a turbomolecular pump.

In addition, as explained above, QCMs can become unreliable, particularly in the presence of oxygen and oxides. Should a QCM fail during a run, the device 2 allows the replacement of the QCM during the deposition run without stopping the deposition process. Therefore, run efficiency and throughput are greatly enhanced in the event of QCM failure. In addition, the slit valve 66 can be closed following deposition prior to the time when the heater chamber 10 is flooded with oxygen, thereby further minimizing the amount of contact between the QCMs and oxygen/oxides.

A device that uses multiple, rotatable quartz crystals inside the heater chamber 10 may also be used, thereby limiting the number of times in which the crystals need to be changed (the device rotates to the next crystal thereby avoiding pump down between runs). Atomic absorption techniques may also be employed to monitor the deposition process. For example, radiation beams used in atomic absorption measurements may be passed through the deposition plume inside the heater through entry and exit ports or windows located in the heater chamber 10 (not shown).

Figure 33A:
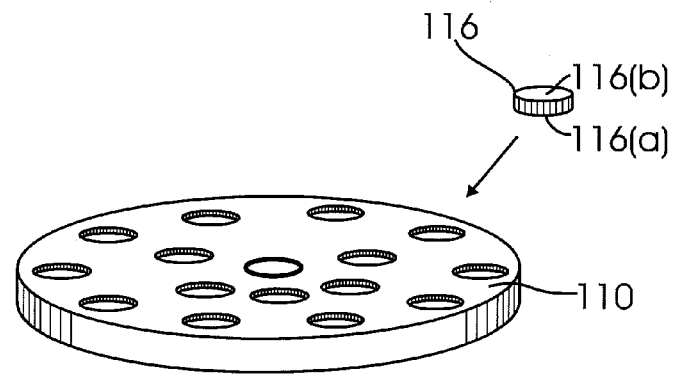
FIG. 33A illustrates a substrate support member and substrate according to one preferred aspect of the invention.
Figure 33B:
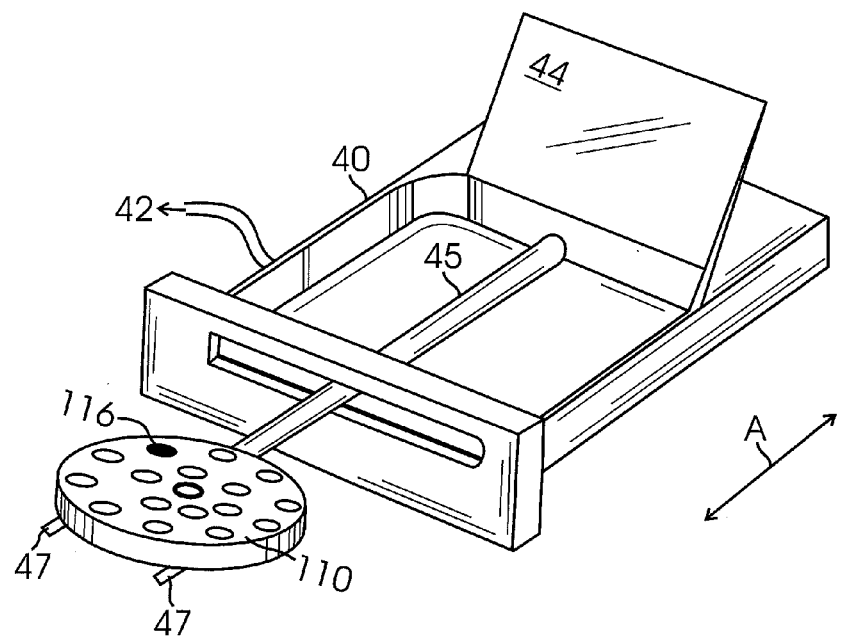
FIG. 33B illustrates a transfer chamber used to load a substrate support member into the heater chamber of the device shown in FIG. 1.

With reference now to FIGS. 33A and 33B, in one aspect of the device 2, two transfer chambers 40, 50 are provided for the loading and unloading of the substrate support member 110 containing substrate(s) 116. FIG. 33B depicts one of the loading transfer chamber 40. Both transfer chambers 40, 50, however, are essentially identical and operate in the same manner. As seen in FIG. 1, the two transfer chambers 40, 50 are located directly across from one another on each side of the heater chamber 10. Of course, the transfer chambers 40, 50 may be located on different sides or the same side of the heater chamber 10. A slit in the wall of the heater chamber 10 allows passage of the substrate support member 110 into and out the heater chamber 10. The heater chamber 10 is isolated from the two transfer chambers 40, 50 by valves 41 (see FIG. 1).

Referring back to FIG. 33B, during operation, the substrate support member 110 is taken from a room temperature and pressure environment and placed into the loading transfer chamber 40 using a door 44 located on top of the transfer chamber 40. When the door 44 is closed, the transfer chamber 40 is pumped to vacuum using a source of vacuum 42 (52 in the case of unloading transfer chamber 50). The substrate support member 110 is placed on an extendable transfer arm 45 including multiple tines 47 for holding the substrate support member 110. The extendable transfer arm 45 is moveable in the direction of arrow A shown in FIG. 33B.

A rotary drive disposed on the underside of the transfer chamber 40 (not shown) provides horizontal displacement of the transfer arm 45 using magnetic coupling. In this regard, the motorized components are contained outside the transfer chambers 40, 50. By magnetically coupling the transfer arm 45 to the external rotary drive, there is no need to expose the drive mechanism to a vacuum environment.

When the transfer chamber 40 has been pumped to vacuum, the valve 41 (as seen in FIG. 1) connecting the transfer chamber 40 the heater chamber 10 is opened, and the substrate support member 110 is extended into the heater chamber 10 by activating the rotary drive.

For unloading operations, the reverse sequence of events occurs in the unloading transfer chamber 50. In particular, the transfer arm 45 retrieves the substrate support member 110 from the heater chamber 10 and retracts into the transfer chamber 50. The transfer chamber 50 can then be vented to atmosphere or a soak routine can be employed. The door 44 can then be opened and the substrate support member 110 retrieved.

An optional heater (not shown) may be included in the transfer chamber 40 to pre-heat the substrate-laden substrate support member 110 prior to introduction into the heater chamber 10. Preferably, the substrate support member 110 is heated radiatively. This pre-heating may be accomplished by heater lamps, coils, or other heating elements disposed on the transfer chamber 40.

Referring back to FIG. 1, the source chamber 30 of the device 2 includes one or more evaporation sources e.g., sources 80a, 80b, and 80c. The sources 80a, 80b, and 80c may include crucibles 81a, 81b, 81c, boats, or the like filled with source material. As one example, Yttrium (Y) might be placed in crucible 81 a while Copper (Cu) might be placed in crucible 81b. Source material is placed inside the crucible 81a, 81b, 81c or similar structure and heated to evaporation temperatures. For example, an e-gun assembly or the like may be used to heat the source material. As one additional example, the source material may include Barium (Ba) in the case of YBCO thin films. It should be understood that the sources 80 (e.g., 80a, 80b, 80c) may be evaporated using any technique including, but not limited to, electron beams, Knudsen cells, resistive boats, sputtering, laser ablation, etc.

The following is a description of a process used to deposit YBCO or other oxide films using reactive coevaporation.

First, the quartz crystals used to monitor the overall flux in the heating chamber 10 are replaced by first venting the heater chamber 10, opening the heater chamber door 10(*a*), replacing the quartz crystals, closing the heater chamber door 10(*a*), and pumping down the heater chamber 10 to vacuum conditions.

Next, the deposition monitors 64 (e.g., QCMs) are changed in the monitor chamber 60. This is accomplished by venting the monitor chamber 60, opening the front face 62, replacing the deposition monitors 64, close the front face 62, and pumping down the deposition monitor 64 to vacuum conditions.

If necessary, source materials are loaded into crucibles 81a, 81b, 81c (or other source holders). In this procedure, the source chamber 30 is vented to atmosphere and opened. Additional and/or replacement source material is loaded into one or more of the crucibles 81a, 81b, 81c. The source chamber 30 is then closed and pumped to vacuum.

Substrates 116 are loaded in the device 2 by initially loading one or more substrates 116 onto the substrate support member 110. Transfer chamber 40 is vented to atmosphere and the door 44 is opened. The loaded substrate support member 110 is then placed on the tines 47 of the transfer arm 45. The door 44 is then closed and the transfer chamber 40 is pumped to vacuum. The valve 41 between the transfer chamber 40 and the heater chamber 10 is opened to provide access to the heater chamber 10. In addition, the heated cap portion 102 of the pocket heater 100 is raised by the actuator 103. The transfer arm 45 containing the substrate support member 110 is then extended into the heater chamber 10.

When the substrate support member 110 is centrally located beneath the heated cap portion 102 of the pocket heater 100, the spindle 112 is raised in the z-direction to engage the substrate support member 110. The substrate support member 110 is lifted off the tines 47 of the transfer arm 45 by the raised spindle 112. The transfer arm 45 is then withdrawn back into the transfer chamber 40. The valve 41 is closed and the spindle 112 is lowered to the desired height to form the gap between the substrate support member 110 and the lower heater plate 104.

Next, the upper heater zones 101b, 101c of the pocket heater 100 are lowered into position using the actuator 103. Rotation of the substrate support member 110 is then initiated. The substrate support member 110 is lowered toward the lower heater plate 104 until the desired gap is established. Oxygen flow is initiated to the reaction pocket, and the flow rate and gap (i.e., distance between the substrate support member 110 and lower heater plate 104) are adjusted to provide the desired oxygen pressure inside the pocket. The heater coils are energized to ramp the pocket heater 100 to the desired temperature. The source materials are then evaporated. At this point, the gate valve 36 is opened between the heater chamber 10 and the source chamber 30. A shutter is interposed between the substrate support member 110 and source chamber 30 to prevent deposition onto the substrates 116. A second shutter located in the source chamber that is interposed between the source materials and the gate valve 36 is also opened. The slit valve 66 in the monitor chamber 60 is opened and evaporation rates of the source materials are adjusted based on measurements made with the deposition monitors 64.

Once the pocket heater 100 is at the desired temperature and the desired rates of evaporation of the source materials are reached, the shutter interposed between the substrate support member 110 and source chamber 30 is opened to allow deposition onto the rotating substrates 116.

Once the desired thickness of film has been reached, the first and second shutters described above are closed. After the two shutters are closed, the gate valve 36 between the heater chamber 10 and the source chamber 30 is closed. The heater chamber 10 is then backfilled with oxygen gas. The temperature of the pocket heater 100 is then ramped down. The crucibles 81a, 81b, 81c are then cooled down. Once the heater chamber 10 (or pocket heater 100) temperature is low enough, the heated cap portion 102 of the pocket heater 100 is raised in the vertical direction via the actuator 103. The substrate support member 110 is raised from the lower heater plate 104 using the moveable spindle 112.

With the substrate support member 110 raised form the lower heater plate 104, the pressure in the transfer chamber (unloading) 50 is equalized with the pressure of the heater chamber 10 using an equalization circuit. The valve 41 is opened and the transfer arm 45 is extended into the heater chamber 10. The substrate support member 110 is then lowered onto the tines 47 of the transfer arm 45 using the cam device 130. The transfer arm 35 (and substrate support member 110) is then withdrawn back into the transfer chamber 50 and the valve 41 is closed. When the substrate support member 110 is cool, the transfer chamber 50 is vented to atmosphere. The door 44 can be opened and the substrate support member 110 containing the HTS thin film-laden substrates 116 is removed.

Figure 34:
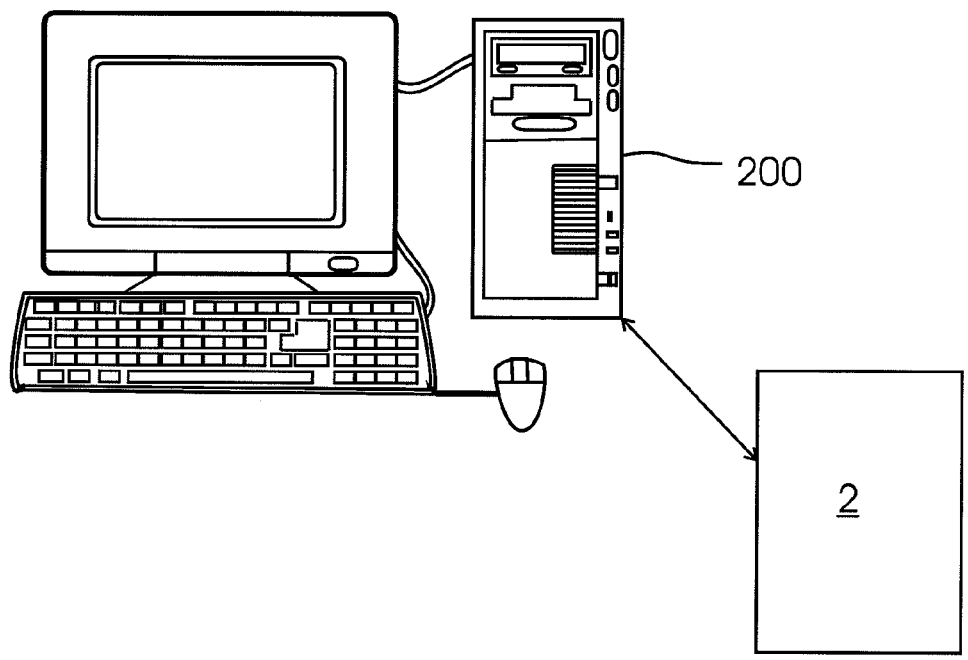
FIG. 34 illustrates a computer used in for controlling as well as acquiring data from the device shown in FIG. 1.

In a preferred aspect of the invention, the device 2 and process described above is run by a computer 200 such as that shown in FIG. 34 (i.e., microprocessor) having software loaded thereon that is able to control and monitor the deposition process. The computer 200 advantageously controls the pumps, heaters, valves, transfer arms, actuators, motors, cam device, flux sources and the like. In addition, the computer 200 is able to acquire data from the device 2 such as, for example, temperatures and pressures in the various chambers of the device. The computer 200 also receives data from the deposition monitors 64 in order that the deposition process can be monitored during a particular run. Preferably, the software is implemented using a graphical user interface (GUI) making the software user friendly.

While the invention is susceptible to various modifications, and alternative forms, specific examples thereof have been shown in the drawings and are herein described in detail. It should be understood, however, that the invention is not to be limited to the particular forms or methods disclosed, but to the contrary, the invention is to cover all modifications, equivalents and alternatives falling within the spirit and scope of the appended claims.

What is claimed is:

1. A reactor apparatus comprising:
    a deposition chamber coupled to a first source of vacuum, the deposition chamber exposed to one or more evaporation sources;
    a monitor chamber isolated from the deposition chamber by a vacuum isolation valve and coupled to a second source of vacuum;
    a moveable face plate coupled to rails extending into an interior of the monitor chamber, the at least one removable deposition monitor disposed on the rails and oriented toward the vacuum isolation valve.

2. The reactor apparatus according to claim 1, wherein the first source of vacuum is different than the second source of vacuum.

3. The reactor apparatus according to claim 1, wherein the at least one removable deposition monitor comprises a plurality of removable deposition monitors.

4. The reactor apparatus according to claim 1, wherein each of the plurality of deposition monitors is directed to a different evaporation source.

5. The reactor apparatus according to claim 4, wherein the deposition monitors are rotatable on the rails to position one of the plurality deposition monitors toward the vacuum isolation valve.

6. The reactor apparatus according to claim 4, further comprising dividers separating each of the plurality of deposition monitors.

7. The reactor apparatus according to claim 1, wherein the one or more evaporation sources are contained in a source chamber separate from the deposition chamber.

8. The reactor apparatus according to claim 1, wherein the source chamber is coupled to a third source of vacuum.

* * * * *